United States Patent
Miyoshi et al.

(10) Patent No.: US 7,214,455 B2
(45) Date of Patent: May 8, 2007

(54) PHOTOSENSITIVE RESIN COMPOSITION AND PROCESS FOR PRODUCING HEAT-RESISTANT RESIN FILM

(75) Inventors: Kazuto Miyoshi, Shiga (JP); Ryoji Okuda, Shiga (JP); Masao Tomikawa, Otsu (JP)

(73) Assignee: Toray Industries, Inc., Tokyo (JP)

( * ) Notice: Subject to any disclaimer, the term of this patent is extended or adjusted under 35 U.S.C. 154(b) by 0 days.

(21) Appl. No.: 10/514,812

(22) PCT Filed: May 28, 2003

(86) PCT No.: PCT/JP03/06654

§ 371 (c)(1),
(2), (4) Date: Nov. 18, 2004

(87) PCT Pub. No.: WO03/100522

PCT Pub. Date: Dec. 4, 2003

(65) Prior Publication Data

US 2005/0202337 A1    Sep. 15, 2005

(30) Foreign Application Priority Data

May 29, 2002  (JP)  ............... 2002-155460

(51) Int. Cl.
*G03F 7/023* (2006.01)
*G03F 7/30* (2006.01)

(52) U.S. Cl. ............... 430/18; 430/165; 430/191; 430/192; 430/193; 430/326; 430/330

(58) Field of Classification Search ............... 430/191, 430/192, 193, 326, 330, 18, 165
See application file for complete search history.

(56) References Cited

U.S. PATENT DOCUMENTS

| | | | | |
|---|---|---|---|---|
| 5,021,320 A | * | 6/1991 | Mueller et al. | 430/192 |
| 5,302,489 A | * | 4/1994 | Shu | 430/191 |
| 5,376,499 A | * | 12/1994 | Hammerschmidt et al. | 430/192 |
| 5,486,447 A | * | 1/1996 | Hammerschmidt et al. | 430/197 |
| 5,916,632 A | | 6/1999 | Mishina et al. | |
| 6,071,666 A | * | 6/2000 | Hirano et al. | 430/191 |
| 6,143,467 A | * | 11/2000 | Hsu et al. | 430/270.1 |
| 6,177,225 B1 | * | 1/2001 | Weber et al. | 430/190 |
| 6,376,151 B1 | * | 4/2002 | Takahashi et al. | 430/192 |
| 2002/0090564 A1 | | 7/2002 | Suwa et al. | |

FOREIGN PATENT DOCUMENTS

| | | |
|---|---|---|
| JP | 60-24545 A | 2/1985 |
| JP | 08-236431 | 9/1996 |
| JP | 08-292557 A | 11/1996 |
| JP | 10-312054 A | 11/1998 |
| JP | 11-100503 A | 4/1999 |
| JP | 11-119417 A | 4/1999 |
| JP | 2000-298341 A | 10/2000 |
| JP | 2001-92138 A | 4/2001 |
| JP | 2002-040223 | 2/2002 |
| JP | 2002-116541 | 4/2002 |

* cited by examiner

*Primary Examiner*—John S. Chu
(74) *Attorney, Agent, or Firm*—Morrison & Foerster LLP

(57) ABSTRACT

The present invention is directed to a photosensitive resin composition comprising (a) a resin having a specific structure, (b) a photosensitive agent, and (c) an organic solvent having a boiling point at atmospheric pressure of 100° C. or higher and 140° C. or lower, the content of the component (c) being 50% by weight or more and 100% by weight or less based on the total amount of the organic solvent, and to a process for producing a heat-resistant resin film using the same. According to the present invention, there is provided a photosensitive resin composition which is less likely to cause defects such as transcribed trace and line drawing.

13 Claims, 3 Drawing Sheets

PHOTOSENSITIVE RESIN COMPOSITION AND PROCESS FOR PRODUCING HEAT-RESISTANT RESIN FILM

TECHNICAL FIELD

The present invention relates to a photosensitive resin composition which is suitably used to form an insulating layer of organic electro-luminescent displays and a surface protective coat and a dielectric film among layers of semiconductor elements, and to a process for producing a heat-resistant resin film.

BACKGROUND ART

While a liquid crystal display (LCD) has been proliferating as the most popular type of a flat panel display, the category of a non-light emitting type display includes, besides LCD, an electrochromic display (ECD). The category of a light emitting type flat panel display includes a plasma display panel (PDP) and an electro-luminescent display (ELD) which are in the limelight recently. Among various types of electro-luminescent displays, an organic electro-luminescent display has the capability of high luminance display and full-color display, and has been researched particularly vigorously.

These flat panel displays are driven by applying a voltage across opposing first and second electrodes, or flowing a current therethrough. Since the electric field tends to concentrate at edges of the electrode where radius of curvature is small, undesirable phenomena are likely to occur at the edges such as dielectric breakdown and leakage current.

As means for preventing such phenomena, it is known to cover the edges of the first electrode with an insulating layer (also referred to as a separator), which mitigates the field concentration at the edges of the electrode. Polyimide resin, novolak resin, acrylic resin or the like is commonly used to form the insulating layer. Each of these resins has variations having different properties of being non-photosensitive, negatively photosensitive and positively photosensitive. Since the use of a photosensitive resin enables it to form the insulating layer in a desired pattern without using a photoresist, complicated production process can be simplified and poor yield of production can be improved. In a conventional process for producing the insulating layer, however, there has been such a problem that transcribed trace is left on the insulating layer thereby deteriorating the product quality. The transcribed trace refers to a visible surface unevenness caused on a heated object by an object that approached or made contact with the heated object.

For example, when a heated object comprising a supporting substrate such as glass substrate coated with a resin composition is dried by heating with a hot plate, the heated object is held on a fixture such as proximity pins and the heated object is heated by the heat of radiation from the hot plate. In this process, transcribed trace often appears at the place where the proximity pins touched. The transcribed trace exerts an adverse influence on the subsequent processes such as exposure and development, and eventually causes such problems as film thickness uniformity of the insulating layer after curing. The transcribed trace appears particularly frequently in polyimide and/or a polyimide precursor resin which are widely used to form the insulating layer.

Methods proposed to prevent the occurrence of transcribed trace include one based on the modification of the heating apparatus. Japanese Patent Laid-Open No. 8-236431 discloses a method wherein a second hot plate that can be moved up and down is provided so as to make contact over the entire surface of a substrate which is to be heated, thereby to eliminate localized temperature gradient. Japanese Patent Laid-Open No. 8-279548 and Japanese Patent Laid-Open No. 2002-40223 disclose such methods that use proximity pins made of a synthetic resin such as polyimide and restrict the contact between the proximity pins and the heated object within an area as small as 0.008 to 0.2 mm$^2$, or form the proximity pins in a tubular shape so as to decrease the heat conductivity.

However, these techniques suppress the occurrence of transcribed trace by modifying the heating apparatus, thus making it necessary to make specific modification for each heating apparatus which is applied, and are therefore expensive and time-consuming. Thus there have been demands for a photosensitive resin composition which is less likely to cause transcribed trace even when a special heating apparatus is not used.

DISCLOSURE OF THE INVENTION

The present invention provides a photosensitive resin composition comprising: (a) a resin having a structure represented by the general formula (1):

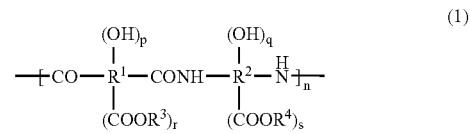

wherein $R^1$ represents a di- to octavalent organic group having at least 2 carbon atoms, $R^2$ represents a di- to hexavalent organic group having at least 2 carbon atoms, $R^3$ and $R^4$ may be the same or different and represent a hydrogen atom or an organic group having 1 to 20 carbon atoms, n is in the range from 5 to 100000, p and q each is in the range from 0 to 4, r and s each is in the range from 0 to 2, and p+q>0; (b) a photosensitive agent; and (c) an organic solvent having a boiling point at atmospheric pressure of 100° C. or higher and 140° C. or lower, the content of the component (c) being 50% by weight or more and 100% by weight or less based on the total amount of the organic solvent.

Also the present invention provides a process for producing a heat-resistant resin film, which comprises the steps of: applying the above photosensitive resin composition onto a substrate to form a photosensitive resin film; drying the photosensitive resin film; exposing the photosensitive resin film; developing the exposed photosensitive resin film; and subjecting to a heat treatment.

Also the present invention provides a process for producing an organic electro-luminescent display, which comprises at least the steps of: applying the above photosensitive resin composition onto a substrate on which a first electrode is formed to form a photosensitive resin film; drying, exposing, developing and heat-treating the photosensitive resin film to form an insulating layer; forming a luminescent layer; and forming a second electrode.

Also the present invention includes an organic electro-luminescent display comprising the heat-resistant resin film obtained by the above process, and electronic components comprising the heat-resistant resin film obtained by the above process as a surface protective coat or a dielectric film among layers.

BRIEF DESCRIPTION OF THE REFERENCE SYMBOLS

Figure 1:
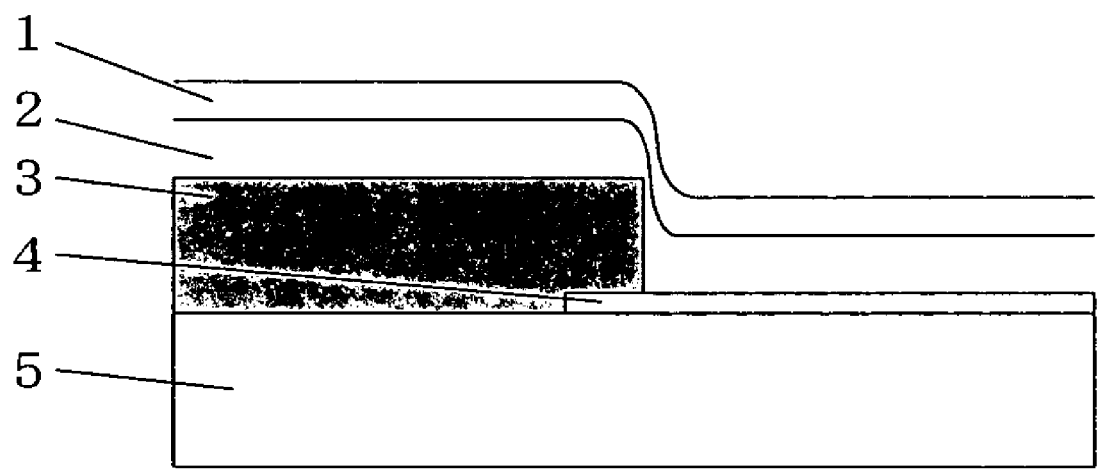
FIG. 1 is a sectional view showing an insulating layer having a rectangular shape.

1: Second electrode
2: Organic luminescent layer
3: Insulating layer
4: First electrode
5: Substrate
6: Slit die
7: Proximity pins
8: Hot plate
9: Contact surface with glass substrate: $S_2$
10: Cross section: $S_1$

BEST MODE FOR CARRYING OUT THE INVENTION

Hereinafter, a resin selected from among resins having structures represented by the above general formula (1) is referred to as a component (a). The component (a) can be formed into a polymer having a ring structure such as an imide ring or an oxazole ring by heating or in the presence of a suitable catalyst. The ring structure remarkably increases the heat resistance and resistance to organic solvent of the resulting polymer. The component (a) is preferably a polyimide precursor or a polybenzoxazole precursor because it is excellent in heat resistance and exhibits excellent characteristics suited for use as an insulating layer of organic electro-luminescent displays, or a surface protective coat and a dielectric film among layers of semiconductor elements. That is, the component (a) is a heat-resistant resin precursor and the heat-resistant resin is obtained by heating the component (a). As used herein, the heat-resistant resin refers to a polymer having a ring structure such as an imide ring or an oxazole ring, for example, a polyimide resin or a polybenzoxazole resin.

In the above general formula (1), $R^1$ represents an acid dianhydride residue and is a di- to octavalent organic group having at least 2 carbon atoms. $R^1$ is preferably a tri- to tetravalent organic group having 6 to 30 carbon atoms, which has an aromatic ring or an aliphatic ring and also has 0 to 2 hydroxy groups. $R^2$ represents a diamine residue and is a di- to hexavalent organic group having at least 2 carbon atoms. $R^2$ preferably has an aromatic ring in view of the heat resistance of the resulting polymer.

In the general formula (1), $R^3$ and $R^4$ may be the same or different and represent a hydrogen atom or organic group having 1 to 20 carbon atoms. When the number of carbon atoms of $R^3$ and $R^4$ exceeds 20, it becomes hard to dissolve the resulting polymer in a developer. The organic group having 1 to 20 carbon atoms is particularly preferably an alkyl group, or an organic group having a carbon-carbon unsaturated double bond. r and s each is independently in the range from 0 to 2.

When the photosensitive resin composition is a positive photosensitive resin composition, $R^3$ and $R^4$ are preferably a hydrogen atom or an alkyl group. In view of the stability of the photosensitive resin composition, $R^3$ and $R^4$ preferably represent an alkyl group. In view of the solubility in the developer, a hydrogen atom is preferable. A hydrogen atom and an alkyl group can also coexist. Specific examples of the alkyl group include, but are not limited to, methyl group, ethyl group, n-propyl group, isopropyl group, t-butyl group, n-butyl group, isobutyl group and n-hexyl group. $R^3$ and $R^4$ include at least one alkyl group having 1 to 16 carbon atoms and the others are preferably hydrogen atoms. Since the speed of dissolution in the developer varies by controlling the contents of the hydrogen atom and the alkyl group, a photosensitive resin composition having a suitable dissolution speed can be obtained by the control of the contents. The hydrogen atom preferably accounts for 10 to 90 mol % of $R^3$ and $R^4$.

When the photosensitive resin composition is a negative photosensitive resin composition, $R^3$ and $R^4$ preferably represent an organic group having a carbon-carbon unsaturated double bond. It is preferred that the carbon-carbon unsaturated double bond accelerates the crosslinking reaction upon exposure, thereby to enhance the photosensitivity and to increase the strength of the resulting resin. Examples of the organic group having a carbon-carbon unsaturated double bond include, but are not limited to, methyl acrylate group, ethyl acrylate group, propyl acrylate group, methyl methacrylate group, ethyl methacrylate group and propyl methacrylate group.

In the general formula (1), p and q each is independently in the range from 0 to 4 and p+q>0. That is, the component (a) has a hydroxy group. The presence of the hydroxy group contributes to enhance the solubility of the component (a) in the component (c) described hereinafter, that is, an organic solvent having a boiling point at atmospheric pressure of 100° C. or higher and 140° C. or lower as compared with a resin having no hydroxy group. The presence of the hydroxy group is also preferable because the development can be performed using an aqueous alkali solution. The hydroxy group is particularly preferably a phenolic hydroxy group in view of the solubility in an aqueous alkali solution.

n in the general formula (1) represents the number of repetition of the structural unit and is preferably in the range from 5 to 100000. The lower limit of n is more preferably 10 or more. The upper limit of n is more preferably 10000 or less. When n is too small, the pattern shape, resolution, developing performance and heat resistance are liable to deteriorate. When n is too large, the developing performance and sensitivity tend to deteriorate. In the present invention, n is determined by measuring a weight-average molecular weight, in terms of polystyrene, of the component (a) using gel permeation chromatography and dividing the resulting weight-average molecular weight by the molecular weight per structural unit of the component (a).

The weight-average molecular weight, in terms of polystyrene, of the resin as the component (a) obtained by gel permeation chromatography is preferably in the range from 3,000 to 100,000, and more preferably from 5,000 to 50,000.

The resin represented by the general formula (1) is synthesized by a known method. For example, the resin can be synthesized by a method of reacting a tetracarboxylic dianhydride with a diamine compound at low temperature, a method of reacting a tetracarboxylic dianhydride with a diamine compound at low temperature, a method of obtaining a diester from a tetracarboxylic dianhydride and an alcohol and reacting the diester with diamine in the presence of a condensing agent, or a method of obtaining a diester from a tetracarboxylic dianhydride and an alcohol, subjecting the rest of the dicarboxylic acid to acid chlorination and reacting with a diamine.

In the present invention, the end of the component (a) is preferably reacted with an end cap compound. As the end cap compound, monoamines, acid anhydrides, monocarboxylic acids, monoacid chloride compounds and activated monoester compounds can be used. The reaction with the end cap compound is preferable because the number of repetition of the structural unit of the component (a), that is, the molecular weight can be controlled within a preferable range. Also various organic groups can be introduced as an end group by reacting the end of the component (a) with the end cap compound. The component (a) reacted with the end cap compound is preferably a resin selected from among resins having structures represented by the general formulas (2) to (5):

$(R^5)_m$—Y is preferably a group represented by the following general formulas (7) and/or (8).

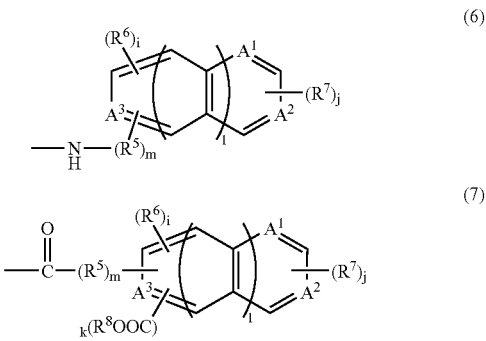

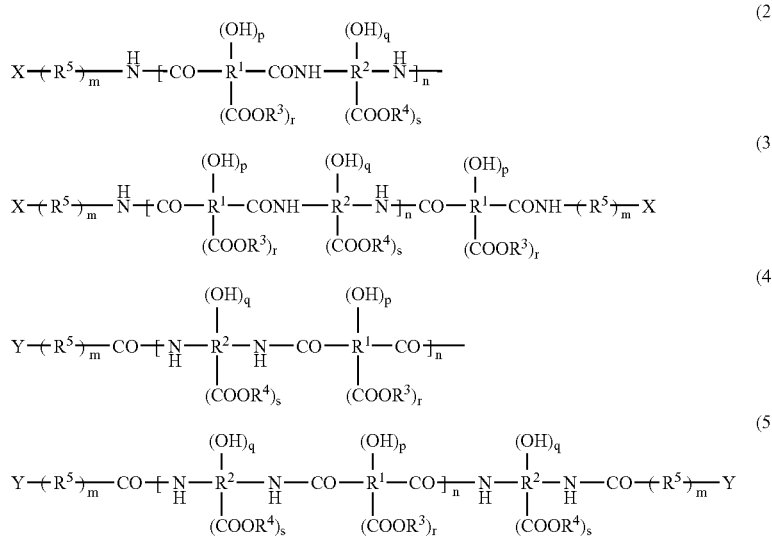

wherein $R^1$, $R^2$, $R^3$, $R^4$, n, p, q, r and s are as defined in the general formula (1), $R^5$ represents a divalent organic group, X and Y each represents an organic group having at least one substituent selected from among carboxyl group, phenolic hydroxy group, sulfonic acid group, thiol group, hydrocarbon group having at least one unsaturated hydrocarbon group and 1 to 10 carbon atoms, nitro group, methylol group, ester group and hydroxyalkynyl group, and m is in the range from 0 to 10.

The organic group represented by X and/or Y further enhances the solubility of the component (a) in the component (c) described hereinafter, that is, an organic solvent having a boiling point at atmospheric pressure of 100° C. or higher and 140° C. or lower.

In the general formulas (2) and (3), —NH—$(R^5)_m$—X is a component derived from a primary monoamine as an end cap compound. —NH—$(R^5)_m$—X is preferably a group represented by the following general formula (6).

In the general formulas (4) and (5), —CO—$(R^5)_m$—Y is a component derived from an end cap compound such as acid anhydride, monocarboxylic acid, monoacid chloride compound or activated monoester compound. —CO—

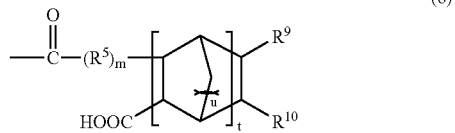

In the general formulas (6) to (8), $R^5$ represents a divalent group selected from among —$CR^8R^9$—, —$CH_2O$— and —$CH_2SO_2$—. $R^9$ and $R^{10}$ represent a hydrogen atom or a monovalent group selected from among hydroxy group, carboxyl group and hydrocarbon group having 1 to 10 carbon atoms. $R^8$ represents a hydrogen atom or a monovalent group selected from among hydrocarbon group having 1 to 10 carbon atoms. Among these, a hydrogen atom or a hydrocarbon group having 1 to 4 carbon atoms is preferable and a hydrogen atom, a methyl group or a t-butyl group is particularly preferable. $R^6$ and $R^7$ represent at least one substituent selected from among hydrogen atom, hydroxy group, carboxyl group, sulfonic acid group, thiol group, hydrocarbon group having 1 to 10 carbon atoms which has at least one unsaturated hydrocarbon group, nitro group, methylol group, ester group, hydroxyalkynyl group and hydrocarbon group having 1 to 10 carbon atoms. $A^1$ to $A^3$ each represents a carbon atom or a nitrogen atom. m is in the range from 0 to 10, and preferably from 0 to 4. l is 0 or 1, and preferably 0. i is 0 or 1, and preferably 0. j is in the range from 1 to 3, and preferably from 1 to 2. k, t and u each represents 0 or 1.

The end cap compound introduced into the polymer can be detected easily by the following method. For example, the polymer into which the end cap compound is introduced is dissolved in an acid solution, thereby to decompose the constituent unit of the polymer into an amine component and an anhydride component, which are then subjected to gas chromatography (GC) or NMR. Alternatively, the polymer into which the end cap compound is introduced is directly subjected to pyrolysis gas chromatography (PGC) or measurement of infrared spectrum and $C^{13}$ NMR spectrum.

The component (a) may contain fluorine in the structure. The presence of fluorine increases the polar moiety, and thus the solubility in the component (c) is remarkably enhanced. Also the presence of fluorine increases the repellency of the interface of the film to some extent, thereby preventing an aqueous alkali solution used upon development from penetrating into the interface. Unfortunately, a fluorine content of more than 20% by weight deteriorates the solubility in an aqueous alkali solution, deteriorates the resistance to organic solvents of the polymer formed into the ring structure by a heat treatment, and also deteriorates the solubility in fuming nitric acid. Accordingly, the fluorine content is preferably 20% by weight or less.

To enhance adhesion properties with a substrate, $R^1$ and $R^2$ may be copolymerized with an aliphatic group having a siloxane structure unless the heat resistance is adversely affected. Specifically, $R^1$ and $R^2$ may be copolymerized with 1 to 10 mol % of bis(3-aminopropyl)tetramethyldisiloxane, bis(p-amino-phenyl)octamethylpentasiloxane, or other amine components.

Specific examples of the acid dianhydride having no hydroxy group used in the present invention include aromatic tetracarboxylic dianhydrides such as pyromellitic dianhydride, 3,3',4,4'-biphenyltetracarboxylic dianhydride, 2,3,3',4'-biphenyltetracarboxylic dianhydride, 2,2',3,3'-biphenyltetracarboxylic dianhydride, 3,3',4,4'-benzophenonetetracarboxylic dianhydride, 2,2',3,3'-benzophenonetetracarboxylic dianhydride, 2,2-bis(3,4-dicarboxyphenyl)propane dianhydride, 2,2-bis(2,3-dicarboxyphenyl)propane dianhydride, 1,1-bis(3,4-dicarboxyphenyl)ethane dianhydride, 1,1-bis(2,3-dicarboxyphenyl)ethane dianhydride, bis(3,4-dicarboxyphenyl)methane dianhydride, bis(2,3-dicarboxyphenyl)methane dianhydride, bis(3,4-dicarboxyphenyl)sulfone dianhydride, bis(3,4-dicarboxyphenyl)ether dianhydride, 2,2-bis(4-(4-aminophenoxy)phenyl)propane, 1,2,5,6-naphthalenetetracarboxylic dianhydride, 2,3,6,7-naphthalenetetracarboxylic dianhydride, 2,3,5,6-pyridinetetracarboxylic dianhydride, 3,4,9,10-perylenetetracarboxylic dianhydride, 2,2-bis(3,4-dicarboxyphenyl)hexafluoropropane dianhydride, 2,2-bis(4-(3,4-dicarboxyphenoxy)phenyl)hexafluoropropane dianhydride, 2,2-bis(4-(3,4-dicarboxybenzoyloxy)phenyl)hexafluoropropane dianhydride and 2,2'-bis(trifluoromethyl)-4,4'-bis(3,4-dicarboxyphenoxy)biphenyl dianhydride; and aliphatic tetracarboxylic dianhydrides such as cyclobutanetetracarboxylic dianhydride, 1,2,3,4-cyclopentanetetracarboxylic dianhydride, 2,3,5,6-cyclohexanetetracarboxylic dianhydride, 5-(2,5-dioxotetrahydro-3-furanyl)-3-methyl-3-cyclohexene-1,2-dicarboxylic anhydride, and "TDA100, Rika Resin TMEG" (trade name, produced by New Japan Chemical Co., Ltd.). Among these acid dianhydrides, preferable acid dianhydrides are 3,3',4,4'-biphenyltetracarboxylic dianhydride, 2,3,3',4'-biphenyltetracarboxylic dianhydride, 2,2',3,3'-biphenyltetracarboxylic dianhydride, 3,3',4,4'-benzophenonetetracarboxylic dianhydride, 2,2',3,3'-benzophenonetetracarboxylic dianhydride, 2,2-bis(3,4-dicarboxyphenyl)propane dianhydride, 2,2-bis(2,3-dicarboxyphenyl)propane dianhydride, 1,1-bis(3,4-dicarboxyphenyl)ethane dianhydride, 1,1-bis(2,3-dicarboxyphenyl)ethane dianhydride, bis(3,4-dicarboxyphenyl)methane dianhydride, bis(2,3-dicarboxyphenyl)methane dianhydride, bis(3,4-dicarboxyphenyl)sulfone dianhydride, bis(3,4-dicarboxyphenyl)ether dianhydride, 2,2-bis(4-(4-aminophenoxy)phenyl)propane, 2,2-bis(3,4-dicarboxyphenyl)hexafluoropropane dianhydride, 2,2-bis(4-(3,4-dicarboxybenzoyloxy)phenyl)hexafluoropropane dianhydride and 2,2'-bis(trifluoromethyl)-4,4'-bis(3,4-dicarboxyphenoxy)biphenyl dianhydride.

Examples of a preferable compound having a hydroxy group include those having the following structures.

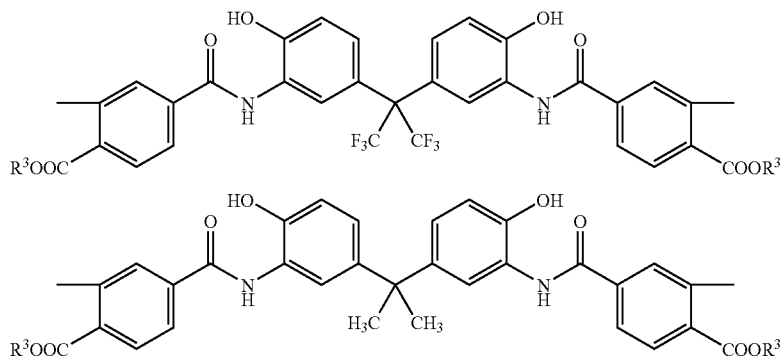

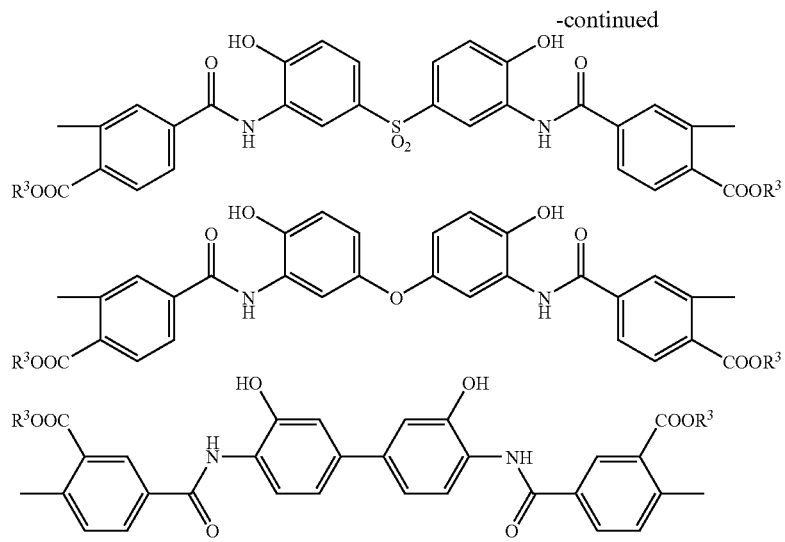

These compounds can be used alone or in combination.

Specific examples of the diamine having no hydroxy group used in the present invention include, but are not limited to, 3,4'-diaminodiphenyl ether, 4,4'-diaminodiphenyl ether, 3,4'-diaminodiphenylmethane, 4,4'-diaminodiphenylmethane, 3,4'-diaminodiphenylsulfone, 4,4'-diaminodiphenylsulfone, 3,4'-diaminodiphenylsulfide, 4,4'-diaminodiphenylsulfide, 1,4-bis(4-aminophenoxy)benzene, benzine, m-phenylenediamine, P-phenylenediamine, 3,5-diaminobenzoic acid, 1,5-naphthalenediamine, 2,6-naphthalenediamine, bis(4-aminophenoxyphenyl)sulfone, bis(3-aminophenoxyphenyl)sulfone, bis(4-aminophenoxy)biphenyl, bis{4-(4-aminophenoxy)phenyl}ether, 1,4-bis(4-aminophenoxy)benzene, 2,2'-dimethyl-4,4'-diaminobiphenyl, 2,2'-diethyl-4,4'-diaminobiphenyl, 3,3'-dimethyl-4,4'-diaminobiphenyl, 3,3'-diethyl-4,4'-diaminobiphenyl, 2,2',3,3'-tetramethyl-4,4'-diaminobiphenyl, 3,3',4,4'-tetramethyl-4,4'-diaminobiphenyl, 2,2'-di(trifluoromethyl)-4,4'-diaminobiphenyl; compounds in which the aromatic ring of these diamines is substituted with an alkyl group or a halogen atom; and aliphatic cyclohexyldiamines and methylenebiscyclohexylamine. These compounds may be used alone or in combination.

Examples of a compound having a hydroxy group include compounds having a fluorine atom such as 2,2-bis[4-(amino-3-hydroxyphenyl)hexafluoropropane and 2,2-bis[4-(4-amino-3-hydroxyphenoxy)phenyl]hexafluoropropane; compounds having no fluorine atom such as diaminodihydroxypyrimidine, diaminodihydroxypyridine, hydroxy-diamino-pyrimidine, diaminophenol and dihydroxybentizin; compounds such as "ABCH" and "ABPS" (trade names, produced by Nippon Kayaku Co., Ltd.); and compounds having structures of the general formulas (1) to (4) in which $R^2$ is as follows.

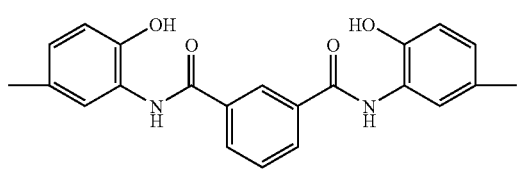

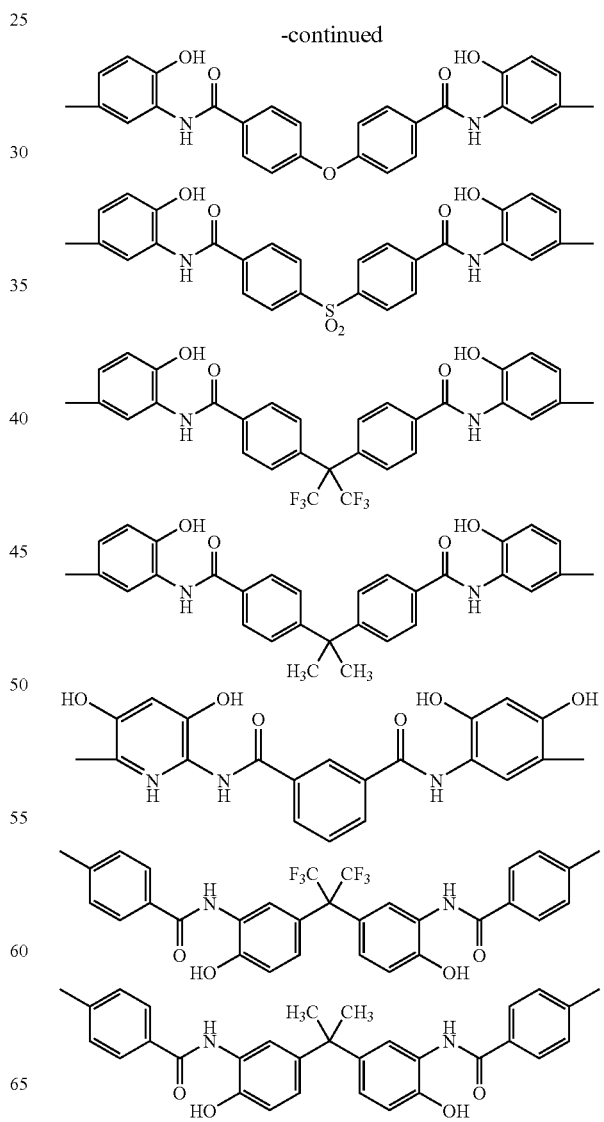

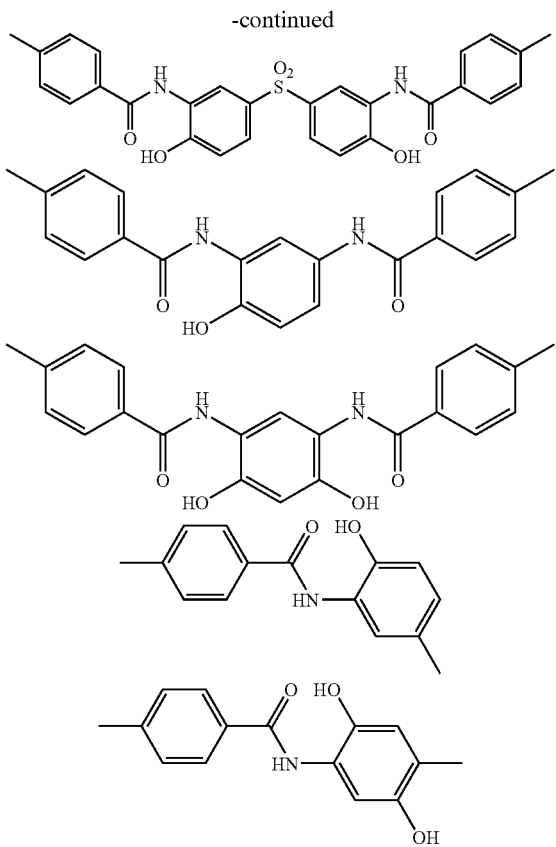

These compounds can be used alone or in combination.

Specific examples of the monoamine used as the end cap compound include, but are not limited to, 5-amino-8-hydroxyquinoline, 4-amino-8-hydroxyquinoline, 1-hydroxy-8-aminonaphthalene, 1-hydroxy-7-aminonaphthalene, 1-hydroxy-6-aminonaphthalene, 1-hydroxy-5-aminonaphthalene, 1-hydroxy-4-aminonaphthalene, 1-hydroxy-3-aminonaphthalene, 1-hydroxy-2-aminonaphthalene, 1-amino-7-hydroxynaphthalene, 2-hydroxy-7-aminonaphthalene, 2-hydroxy-6-aminonaphthalene, 2-hydroxy-5-aminonaphthalene, 2-hydroxy-4-aminonaphthalene, 2-hydroxy-3-aminonaphthalene, 1-amino-2-hydroxynaphthalene, 1-carboxy-8-aminonaphthalene, 1-carboxy-7-aminonaphthalene, 1-carboxy-6-aminonaphthalene, 1-carboxy-5-aminonaphthalene, 1-carboxy-4-aminonaphthalene, 1-carboxy-3-aminonaphthalene, 1-carboxy-2-aminonaphthalene, 1-amino-7-carboxynaphthalene, 2-carboxy-7-aminonaphthalene, 2-carboxy-6-aminonaphthalene, 2-carboxy-5-aminonaphthalene, 2-carboxy-4-aminonaphthalene, 2-carboxy-3-aminonaphthalene, 1-amino-2-carboxynaphthalene, 2-aminonicotinic acid, 4-aminonicotinic acid, 5-aminonicotinic acid, 6-aminonicotinic acid, 4-aminosalicylic acid, 5-aminosalicylic acid, 6-aminosalicylic acid, 3-amino-O-toluic acid, ammelide, 2-aminobenzoic acid, 3-aminobenzoic acid, 4-aminobenzoic acid, 2-aminobenzenesulfonic acid, 3-aminobenzenesulfonic acid, 4-aminobenzenesulfonic acid, 3-amino-4,6-dihydroxypyrimidine, 2-aminophenol, 3-aminophenol, 4-aminophenol, 5-amino-8-mercaptoquinoline, 4-amino-8-mercaptoquinoline, 1-mercapto-8-aminonaphthalene, 1-mercapto-7-aminonaphthalene, 1-mercapto-6-aminonaphthalene, 1-mercapto-5-aminonaphthalene, 1-mercapto-4-aminonaphthalene, 1-mercapto-3-aminonaphthalene, 1-mercapto-2-aminonaphthalene, 1-amino-7-mercaptonaphthalene, 2-mercapto-7-aminonaphthalene, 2-mercapto-6-aminonaphthalene, 2-mercapto-5-aminonaphthalene, 2-mercapto-4-aminonaphthalene, 2-mercapto-3-aminonaphthalene, 1-amino-2-mercaptonaphthalene, 3-amino-4,6-dimercaptopyrimidine, 2-aminothiophenol, 3-aminothiophenol, 4-aminothiophenol, 2-ethynylaniline, 3-ethynylaniline, 4-ethynylaniline, 2,4-diethynylaniline, 2,5-diethynylaniline, 2,6-diethynylaniline, 3,4-diethynylaniline, 3,5-diethynylaniline, 1-ethynyl-2-aminonaphthalene, 1-ethynyl-3-aminonaphthalene, 1-ethynyl-4-aminonaphthalene, 1-ethynyl-5-aminonaphthalene, 1-ethynyl-6-aminonaphthalene, 1-ethynyl-7-aminonaphthalene, 1-ethynyl-8-aminonaphthalene, 2-ethynyl-1-aminonaphthalene, 2-ethynyl-3-aminonaphthalene, 2-ethynyl-4-aminonaphthalene, 2-ethynyl-5-aminonaphthalene, 2-ethynyl-6-aminonaphthalene, 2-ethynyl-7-aminonaphthalene, 2-ethynyl-8-aminonaphthalene, 3,5-diethynyl-1-aminonaphthalene, 3,5-diethynyl-2-aminonaphthalene, 3,6-diethynyl-1-aminonaphthalene, 3,6-diethynyl-2-aminonaphthalene, 3,7-diethynyl-1-aminonaphthalene, 3,7-diethynyl-2-aminonaphthalene, 4,8-diethynyl-1-aminonaphthalene and 4,8-diethynyl-2-aminonaphthalene.

Among these monoamines, preferable monoamines are 5-amino-8-hydroxyquinoline, 1-hydroxy-7-aminonaphthalene, 1-hydroxy-6-aminonaphthalene, 1-hydroxy-5-aminonaphthalene, 1-hydroxy-4-aminonaphthalene, 2-hydroxy-7-aminonaphthalene, 2-hydroxy-6-aminonaphthalene, 2-hydroxy-5-aminonaphthalene, 1-carboxy-7-aminonaphthalene, 1-carboxy-6-aminonaphthalene, 1-carboxy-5-aminonaphthalene, 2-carboxy-7-aminonaphthalene, 2-carboxy-6-aminonaphthalene, 2-carboxy-5-aminonaphthalene, 2-aminobenzoic acid, 3-aminobenzoic acid, 4-aminobenzoic acid, 4-aminosalicylic acid, 5-aminosalicylic acid, 6-aminosalicylic acid, 2-aminobenzenesulfonic acid, 3-aminobenzenesulfonic acid, 4-aminobenzenesulfonic acid, 3-amino-4,6-dihydroxypyrimidine, 2-aminophenol, 3-aminophenol, 4-aminophenol, 2-aminothiophenol, 3-aminothiophenol, 4-aminothiophenol, 3-ethynylaniline, 4-ethynylaniline, 3,4-diethynylaniline and 3,5-diethynylaniline.

Specific examples of the compound selected from among acid anhydrides, monocarboxylic acids, monoacid chloride compounds and activated monoester compounds used as the end cap compound include acid anhydrides such as phthalic anhydride, maleic anhydride, nadic anhydride, cyclohexanedicarboxylic anhydride and 3-hydroxyphthalic anhydride; monocarboxylic acids such as 2-carboxyphenol, 3-carboxyphenol, 4-carboxyphenol, 2-carboxythiophenol, 3-carboxythiophenol, 4-carboxythiophenol, 1-hydroxy-8-carboxynaphthalene, 1-hydroxy-7-carboxynaphthalene, 1-hydroxy-6-carboxynaphthalene, 1-hydroxy-5-carboxynaphthalene, 1-hydroxy-4-carboxynaphthalene, 1-hydroxy-3-carboxynaphthalene, 1-hydroxy-2-carboxynaphthalene, 1-mercapto-8-carboxynaphthalene, 1-mercapto-7-carboxynaphthalene, 1-mercapto-6-carboxynaphthalene, 1-mercapto-5-carboxynaphthalene, 1-mercapto-4-carboxynaphthalene, 1-mercapto-3-carboxynaphthalene, 1-mercapto-2-carboxynaphthalene, 2-carboxybenzenesulfonic acid, 3-carboxybenzenesulfonic acid, 4-carboxybenzenesulfonic acid, 2-ethynylbenzoic acid, 3-ethynylbenzoic acid, 4-ethynylbenzoic acid, 2,4-diethynylbenzoic acid, 2,5-diethynylbenzoic acid, 2,6-diethynylbenzoic acid, 3,4-diethynylbenzoic acid, 3,5-diethynylbenzoic acid, 2-ethynyl-1-naphthoic acid, 3-ethynyl-1-naphthoic acid, 4-ethynyl-1-naphthoic acid, 5-ethynyl-1-naphthoic acid, 6-ethynyl-1-naphthoic acid, 7-ethynyl-1-naphthoic acid, 8-ethynyl-1- naphthoic acid, 2-ethynyl-2-naphthoic acid, 3-ethynyl-2-naphthoic acid, 4-ethynyl-2-naphthoic acid, 5-ethynyl-2-naphthoic acid, 6-ethynyl-2-naphthoic acid, 7-ethynyl-2-naphthoic acid and 8-ethynyl-2-naphthoic acid; monoacid chloride compounds formed by acid chlorination of carboxyl groups of these monocarboxylic acids; monoacid chloride compounds formed by acid chlorination of only monocarboxyl groups of dicarboxylic acids, such as terephthalic acid, phthalic acid, maleic acid, cyclohexanedicarboxylic acid, 3-hydroxyphthalic acid, 5-norbornene-2,3-dicarboxylic acid, 1,2-dicarboxynaphthalene, 1,3-dicarboxynaphthalene, 1,4-dicarboxynaphthalene, 1,5-dicarboxynaphthalene, 1,6-dicarboxynaphthalene, 1,7-dicarboxynaphthalene, 1,8-dicarboxynaphthalene, 2,3-dicarboxynaphthalene, 2,6-dicarboxynaphthalene and 2,7-dicarboxynaphthalene; and activated ester compounds obtained by reacting monoacid chloride compounds with N-hydroxybenzotriazole or N-hydroxy-5-norbornene-2,3-dicarboxyimide.

Among these compounds, preferable compounds are acid anhydrides such as phthalic anhydride, maleic anhydride, nadic anhydride, cyclohexanedicarboxylic anhydride and 3-hydroxyphthalic anhydride; monocarboxylic acids such as 3-carboxyphenol, 4-carboxyphenol, 3-carboxythiophenol, 4-carboxythiophenol, 1-hydroxy-7-carboxynaphthalene, 1-hydroxy-6-carboxynaphthalene, 1-hydroxy-5-carboxynaphthalene, 1-mercapto-7-carboxynaphthalene, 1-mercapto-6-carboxynaphthalene, 1-mercapto-5-carboxynaphthalene, 3-carboxybenzenesulfonic acid, 4-carboxybenzenesulfonic acid, 3-ethynylbenzoic acid, 4-ethynylbenzoic acid, 3,4-diethynylbenzoic acid and 3,5-diethynylbenzoic acid; monoacid chloride compounds formed by acid chlorination of carboxyl groups of these monocarboxylic acids; monoacid chloride compounds formed by acid chlorination of only monocarboxyl groups of dicarboxylic acids, such as terephthalic acid, phthalic acid, maleic acid, cyclohexanedicarboxylic acid, 1,5-dicarboxynaphthalene, 1,6-dicarboxynaphthalene, 1,7-dicarboxynaphthalene and 2,6-dicarboxynaphthalene; and activated ester compounds obtained by reacting monoacid chloride compounds with N-hydroxybenzotriazole or N-hydroxy-5-norbornene-2,3-dicarboxyimide.

The content of the monoamine used as the end cap compound is preferably in the range from 0.1 to 60 mol %, and particularly preferably from 5 to 50 mol %, based on the entire amine component. The content of the compound selected from among acid anhydrides, monocarboxylic acids, monoacid chloride compounds and activated monoester compounds used as the end cap compound is preferably in the range from 0.1 to 100 mol %, and particularly preferably from 5 to 90 mol %, based on the diamine component. A plurality of end groups may be introduced by reacting with a plurality of end cap compounds.

The resin component contained in the photosensitive resin composition of the present invention may be composed only of a resin having a structure represented by the general formula (1), or a copolymer containing the other structural unit or a blend with the other resin. In that case, the resin component preferably contains 50 mol % or more of a structural unit represented by the general formula (1). The kind and content of the structural unit used for copolymerization or blending is preferably selected unless the heat resistance of a heat-resistant resin film obtained by a final heating treatment is not adversely affected.

Figure 2:
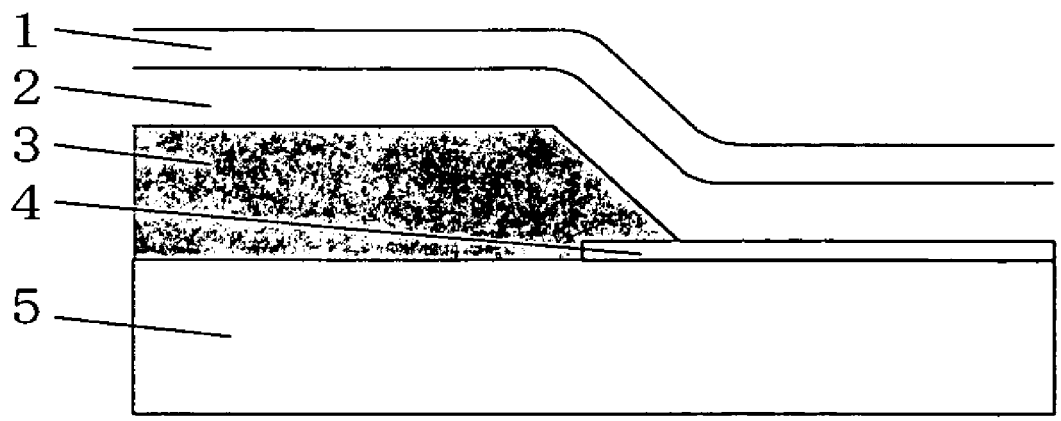
FIG. 2 is a sectional view showing an insulating layer having a forward tapered shape.

The component (b) of the present invention is a photosensitive agent. As the photosensitive agent, any of a positive photosensitive agent and a negative photosensitive agent can be used. The photosensitive agent used in the present invention is preferably a quinonediazide compound. The quinonediazide compound is a photosensitive agent which imparts positive photosensitivity to a resin composition. The resin composition having positive photosensitivity is preferable because radiation available intensity of the exposed area into the coated film gradually decreases toward the bottom from the surface of the coated film upon patterning to form an insulating layer having a smooth forward tapered cross-sectional shape with ease. Particularly in case of forming an insulating layer of a an organic electroluminescent display, when the insulating layer has not a smooth forward tapered cross-sectional shape, a thin film layer and a second electrode provided on the insulating layer sometimes become thin at the boundary portion of the insulating layer, or cause separation, as shown in FIG. 1. These defects lead to defects such as luminescent degradation of the organic electro-luminescent display. To the contrary, as shown in FIG. 2, when the insulating layer has a smooth forward tapered cross-sectional shape, the thin film layer and the second electrode provided on the insulating layer do not become thin at the boundary portion of the insulating layer, or cause no separation. Accordingly, it is particularly preferred to use the positive photosensitive resin composition so as to form the insulating layer of the organic electro-luminescent display.

The quinonediazide compound is preferably an esterified quinonediazide compound, and particularly preferably a compound in which naphthoquinonediazidesulfonic acid is bonded with a compound having a phenolic hydroxy group in an ester form. Compounds having a phenolic hydroxy group as used herein are preferably compounds such as Bis-Z, BisP-EZ, TekP-4HBPA, TrisP-HAP, TrisP-PA, TrisP-PHBA, BisOCHP-Z, BisP-MZ, BisP-PZ, BisP-IPZ, BisOCP-IPZ, BisP-CP, BisRS-2P, BisRS-3P, BisP-OCHP, methylenetris-p-CR, methylenetetra-p-CR, BisRS-26X and Bis-PFP-PC (trade names, produced by Honshu Chemical Industry Co., Ltd.); BIR-OC, BIP-PC, BIR-PC, BIR-PTBP, BIR-PCHP, BIP-BIOC-F, 4PC, BIR-BIPC-F and TEP-BIP-A (trade names, produced by Asahi Organic Chemicals Industry Co., Ltd.); and naphthol, tetrahydroxybenzophenone, methyl gallate, bisphenol A, methylenebisphenol and BisP-AP (trade names, produced by Honshu Chemical Industry Co., Ltd.). Naphthoquinonediazidesulfonic acid is preferably 4-naphthoquinonediazidesulfonic acid or 5-naphthoquinonediazidesulfonic acid.

These naphthoquinonediazide compounds are preferable because of high sensitivity to i line (365 nm), h line (405 nm) and g line (436 nm) from a mercury vapor lamp.

When a naphthoquinonediazide compound used in the present invention has a molecular weight of 1000 or more, the naphthoquinonediazide compound is not sufficiently decomposed by the subsequent heat treatment, thus causing problems such as deterioration of the heat resistance, mechanical characteristic and adhesion properties of the resulting film. From such a point of view, the molecular weight of the naphthoquinonediazide compound is preferably in the range from 300 to 1000. More preferably, it is in the range from 350 to 800. The content of the naphthoquinonediazide compound is in the range from 1 to 50 parts by weight based on 100 parts by weight of the polymer.

In order to enhance the alkali developing performance of the photosensitive heat-resistant precursor composition, the compound having a phenolic hydroxy group may be added as it is without being esterified with naphthoquinonediazide, if necessary. By adding the compound having a phenolic hydroxy group, the resulting resin composition can be dissolved easily in an alkali developer by exposure though it is hardly dissolved in the alkali developer before exposure. Consequently, the thickness of the film is not reduced by development and the development can be completed in a short time. In this case, the content of the compound having a phenolic hydroxy group is preferably in the range from 1 to 50 parts by weight, and more preferably from 3 to 40 parts by weight, based on 100 parts by weight of the polymer.

A photosensitive agent which imparts negative photosensitivity to a resin composition is preferably a photoinitiater. Specific examples of the photoinitiater include, but are not limited to, aromatic amines such as N-phenyldiethanolamine, N-phenylglycine and Michler's ketone; cyclic oxime compounds such as 3-phenyl-5-isoxazolone; chain oxime compounds such as 1-phenylpropanedione-2-(O-ethoxycarbonyl)oxime; benzophenone derivatives such as benzophenone, methyl o-benzoylbenzoate, dibenzyl ketone and fluorenone; and thioxanthone derivatives such as thioxanthone, 2-methylthioxanthone and 2-isopropylthioxanthone.

Also the photoinitiater may be used in combination with a photosensitizer. Examples of preferable sensitizer include those which are commonly used in a photocurable resin, for example, aromatic monoazides such as azideanthraquinone and azidebenzalacetophenone; cumarin compounds such as 3,3'-carbonylbis(diethylaminocumarin); and aromatic ketones such as benzanthrone and phenanthrenequinone. In addition, sensitizers used as an electron transfer agent for electrophotography can also be used preferably.

The content of the photoinitiater or sensitizer is preferably in the range from 0.01 to 30 parts by weight, and more preferably from 0.1 to 20 parts by weight, based on 100 parts by weight of the polymer. When the content is not in the above range, the photosensitivity deteriorates or the mechanical characteristic of the polymer deteriorates, and thus special attention should be paid. These photoinitiaters and sensitizers can be used alone or in combination.

In order to enhance the photosensitivity, a compound having a carbon-carbon double bond may be added. Examples of the compound include 1,6-hexanediol diacrylate, neopentyl glycol diacrylate, ethylene glycol diacrylate, polyethylene glycol diacrylate having an addition mol number of 2 to 20, pentaerythritol diacrylate, dipentaerythritol diacrylate, tetramethylolmethane tetraacrylate and methylenebisacrylamide; and compounds resulting from replacement of di- and tetraacrylates with acrylates or methacrylates and compound resulting from replacement of acrylamide with methacrylamide. These compounds are preferably added in the amount in the range from 1 to 30 parts by weight based on 100 parts by weight of the polymer.

The component (c) in the present invention is an organic solvent having a boiling point at atmospheric pressure of 100° C. or higher and 140° C. or lower. The component (c) having a boiling point of lower than 100° C. is not preferable because there arises a problem that evaporation of the solvent proceeds excessively in case of coating by a slit die coating method and the solid is liable to be precipitated on a coating slit die because of poor solubility of the resin as the component (a), which leads to precipitation of foreign substances, and also arises a problem such as so-called line drawing, that is, striped thickness unevenness appears on the coated film. The component (c) having a boiling point of higher than 140° C. is not preferable because there arises a problem that transcribed trace is liable to occur during the heating and drying step because of poor volatility of the solvent. The content of the component (c) based on the total amount of the organic solvent used in the present invention is preferably 50% by weight or more and 100% by weight or less, more preferably 60% by weight or more and 100% by weight or less, and most preferably 70% by weight or more and 100% by weight or less. By using such a solvent, a high-grade insulating layer with neither transcribed trace nor line drawing can be obtained, preferably.

The organic solvent having a boiling point at atmospheric pressure of 100° C. or higher and 140° C. or lower to be used as the component (c) of the present invention preferably dissolve a resin as the component (a) of the present invention. Specific examples thereof include alkylene glycol monoalkyl ethers such as ethylene glycol monomethyl ether, ethylene glycol monoethyl ether, propylene glycol monomethyl ether and propylene glycol monoethyl ether; alkyl acetates such as propyl acetate, butyl acetate and isobutyl acetate; ketones such as acetylacetone, methyl propyl ketone, methyl butyl ketone, methyl isobutyl ketone and cyclopentanone; alcohols such as butyl alcohol, isobutyl alcohol, pentanol and 4-methyl-2-pentanol; and aromatic hydrocarbons such as toluene and xylene. Among these organic solvents, propylene glycol monomethyl ether or propylene glycol monoethyl ether is preferable.

As the solvent other than the component (c), which accounts for 0% by weight or more and less than 50% by weight, preferably 0% by weight or more and less than 30% by weight, of the entire solvent constituting the photosensitive resin composition of the present invention, a solvent having a boiling point of higher than 140° C. or a boiling point of lower than 100° C. may be used.

Among these solvents, the solvent having a boiling point of higher than 140° C. is preferable. Since a high boiling point solvent is hardly vaporized during the heating and drying step, when a small amount of the high boiling point solvent is added, a small amount of the solvent is remained in the resulting photosensitive resin film. Therefore, the photosensitive resin film is easily developed in the subsequent patterning step, preferably. In view of the solubility of the component (a), a polar solvent is preferable. Examples thereof include N-methyl-2-pyrrolidone, N-cyclohexyl-2-pyrrolidone, N,N-dimethylformamide, N,N-dimethylacetamide, dimethyl sulfoxide, γ-butyrolactone, 3-methyl-3-methoxybutyl acetate, diacetone alcohol, ethyl lactate and butyl lactate. These polar solvents may be used alone or in combination. The content of the solvent having a boiling point of higher than 140° C. is preferably 0% by weight or more and 50% by weight or less based on the total amount of the organic solvent. The content of the solvent having a boiling point of higher than 140° C. of more than 50% by weight is not preferable because transcribed trace is liable to occur in the heating and drying step.

The solvent having a boiling point of lower than 100° C. is not preferable because the coatability becomes inferior in case of coating by a slit die coating method, but can be added in the amount of 0% by weight or more and 30% by weight or less based on the total amount of the solvent. The content of the solvent having a boiling point of lower than 100° C. of more than 30% by weight is not preferable because line drawing is liable to occur in case of coating by a slit die coating method.

In order to enhance the wettability between the photosensitive resin composition and the substrate, surfactants, esters such as propylene glycol monomethyl ether acetate, ethylene glycol monoethyl ether acetate and 3-methoxybutyl acetate, alcohols such as 3-methyl-2-butanol and 3-methyl-3-methoxybutanol, ketones such as cyclohexanone, and ethers such as tetrahydrofuran and dioxane may be added in the amount of 50% by weight or less, and preferably 30% by weight or less, based on the entire solvent, if necessary. Also inorganic particles such as silicon dioxide and titanium dioxide, or polyimide powders can be added.

To enhance adhesion properties with substrates such as silicon wafer and ITO substrate, silane coupling agents and titanium chelating agents can be added to a varnish of the photosensitive resin composition in the amount in the range from 0.5 to 10% by weight.

In case of adding the coupling agent to the varnish, a silane coupling agents such as methylmethacryloxydimethoxysilane or 3-aminopropyltrimethoxysilane, a titanium chelating agent or an aluminum chelating agent is preferably added in the amount in the range from 0.005 to 10% by weight based on the polymer in the varnish.

The organic solvent used in the present invention can be detected easily by measuring $^1$H-NMR of a photosensitive resin composition. In case of containing a plurality of solvents, a ratio of solvent components can be estimated from a peak intensity ratio of the resulting $^1$H-NMR spectrum.

To enhance adhesion properties with the substrate, it is also effective to treat the substrate with the coupling agent described above. In that case, a solution prepared by dissolving 0.5 to 20% by weight of the coupling agent in a solvent such as isopropanol, ethanol, methanol, water, tetrahydrofuran, propylene glycol monomethyl ether acetate, propylene glycol monomethyl ether, ethyl lactate or diethyl adipate is applied onto a substrate by spin coating, slit die coating, bar coating, dip coating or spray coating. In some cases, the reaction between the substrate and the coupling agent is allowed to proceed by heating to the temperature in the range from 50 to 300° C.

The method for forming a heat-resistant resin film pattern using the photosensitive resin composition of the present invention will now be described.

The photosensitive resin composition is applied onto a substrate. Examples of the material of the substrate in the present invention include all materials in which metal for electrode can be provided on the surface, such as silicon wafer, ceramics, gallium arsenic, metal, glass, semiconductor, metal oxide insulating film, silicon nitride and polymer film. Glass is preferably used. Examples of the material of glass include, but are not limited to, alkali zinc borosilicate glass, sodium borosilicate glass, soda lime glass, low alkali borosilicate glass, barium borosilicate glass, borosilicate glass, aluminosilicate glass, fused quartz glass and synthetic quartz glass. Preferably, non-alkali glass generating less eluted ions or soda lime glass provided with a barrier coat made of $SiO_2$ is used. The thickness of the substrate may be a thickness enough to maintain the mechanical strength and is preferably 0.1 mm or more, and more preferably 0.5 mm or more.

Examples of the coating method include slit die coating method, spin coating method, spray coating method, roll coating method and bar coating method, and the coating can be performed by using these coating methods alone or in combination. It is a slit die coating method to which the photosensitive heat-resistant resin composition of the present invention exerts most excellent effect. The slit die coating method is effective to reduce the cost because application can be performed using a small amount of a coating solution. The amount of the coating solution required for the slit die coating method is about ⅕ to ⅒ times smaller than that in case of the spin coating method. On the other hand, the slit die coating method had a problem that defects such as transcribed trace and line drawing are likely to occur. However, when the photosensitive resin composition of the present invention is used, defects such as transcribed trace and line drawing do not occur even if the composition is applied by the slit die coating method.

The thickness of the coated film varies depending on the coating method, solid content and viscosity of the composition, but the thickness of the coated film after drying is commonly set in the range from 0.1 to 100 μm, and preferably from 0.3 to 20 μm.

Then, the substrate coated with the photosensitive resin composition is dried to form a photosensitive resin film. This step is also referred to as a prebaking step. The drying is performed using a hot plate, an oven, infrared rays or a vacuum chamber.

When using the hot plate, a heated object is heated directly on the hot plate, or heated after the heated object is held on a fixture such as proximity pins disposed on the hot plate. Examples of the material of proximity pins include metallic materials such as aluminum and stainless steel and synthetic resins such as polyimide resin and Teflon, and proximity pins made of any material may be used. The height of proximity pins varies depending on the size of the substrate, kind of a resin film as the heated object, and purpose of heating. For example, when a resin film coated on a glass substrate measuring 300×350 mm×0.7 $mm^3$ is heated, the height of proximity pins is preferably in the range from about 2 to 12 mm. The heating temperature varies depending on the kind of the heated object and purpose of heating, but the heating is preferably performed at a temperature in the range from room temperature to 180° C. for one minutes to several hours.

Then, the photosensitive resin composition film is exposed to actinic rays through a mask having a desired pattern. Ultraviolet rays, visible rays, electron rays and X rays are used as actinic rays upon exposure. In the present invention, i line (365 nm), h line (405 nm) and g line (436 nm) from a mercury vapor lamp are preferably used.

In case of the positive photosensitive resin composition, the exposed area is removed with a developer to form a resin film having a desired pattern. In case of the negative photosensitive resin composition, the non-exposed area is removed with a developer to form a resin film having a desired pattern. In both cases, the developer is preferably an aqueous solution of an alkaline compound, such as tetramethylammonium, diethanolamine, diethylaminoethanol, sodium hydroxide, potassium hydroxide, sodium carbonate, potassium carbonate, triethylamine, diethylamine, methylamine, dimethylamine, dimethylaminoethyl acetate, dimethylaminoethanol, dimethylaminoethyl methacrylate, cyclohexylamine, ethylenediamine or hexamethylenediamine. In some cases, polar solvents such as N-methyl-2-pyrrolidone, N,N-dimethylformamide, N,N-dimethylacetamide, dimethyl sulfoxide, γ-butyrolactone and dimethylacrylamide; alcohols such as methanol, ethanol and isopropanol; esters such as ethyl lactate and propylene glycol monomethyl ether acetate; and ketones such as cyclopentanone, cyclohexanone, isobutyl ketone and methyl isobutyl ketone may be added to the aqueous alkali solution alone or in combination. In case of the negative photosensitive resin composition, the above polar solvents containing no aqueous alkali solution, alcohols, esters and ketones can also be used alone or in combination. After the development, the substrate is rinsed with water. The substrate may be rinsed with water containing alcohols such as ethanol and isopropyl alcohol, and esters such as ethyl lactate and propylene glycol monomethyl ether acetate.

After the development, the resin film is converted into a heat-resistant resin film by heating to the temperature in the range from 130 to 500° C. This step is referred to as a postbaking step. This heat treatment is carried out for 5 minutes to 5 hours while heating stepwise or continuously. For example, the resin film is heat-treated at 130, 200 and 350° C. for 30 minutes each. Alternatively, the resin film is continuously heated from room temperature to 250° C. over 2 hours, or heated from room temperature to 400° C. over 2 hours.

The heat-resistant resin film formed of the photosensitive resin composition of the present invention is suitably used to form a passivation layer of semiconductors, a surface protective coat or a dielectric film among layers of electronic components such as semiconductor element, and an insulating layer of organic electro-luminescent displays.

EXAMPLES

The present invention will now be described by way of examples and techniques, but is not limited to these examples. In the examples, the photosensitive resin composition was evaluated as follows.

<Process for Production of Photosensitive Resin Film>

On the surface of non-alkali glass measuring 300×350×0.7 mm³ (#1737, produced by Corning Japan Co., Ltd.), an ITO transparent electrode film having a thickness of 130 nm was formed by a sputter deposition method to prepare a glass substrate measuring 300×350 mm. A photoresist was applied onto the ITO film using a spinner and patterning was performed by exposure and development due to conventional photolithography. After removing the unnecessary portion of ITO by etching, the photoresist was removed to obtain an ITO film having a striped pattern with a length of 90 mm, a width of 80 μm and a pitch of 100 μm. This striped ITO film serves as a first electrode when an organic electro-luminescent display is formed.

On a glass substrate on which an ITO film having a pattern is formed, a photosensitive resin composition (hereinafter referred to as a varnish) was applied so that the thickness of the coated film after drying becomes 1.5 μm. When using a slit die coating method, the coating speed was set to 3 m/min. When using a spin coating method, the rotational speed was set to 1000 rpm and the coating time was set to 10 seconds. Using a hot plate (EA-4331, produced by Chuoriken Co., Ltd.), the glass substrate was dried by heating at 120° C. for 10 minutes while holding it at the height of 5.0 mm from the hot plate with proximity pins to obtain a photosensitive resin film.

Figure 3:
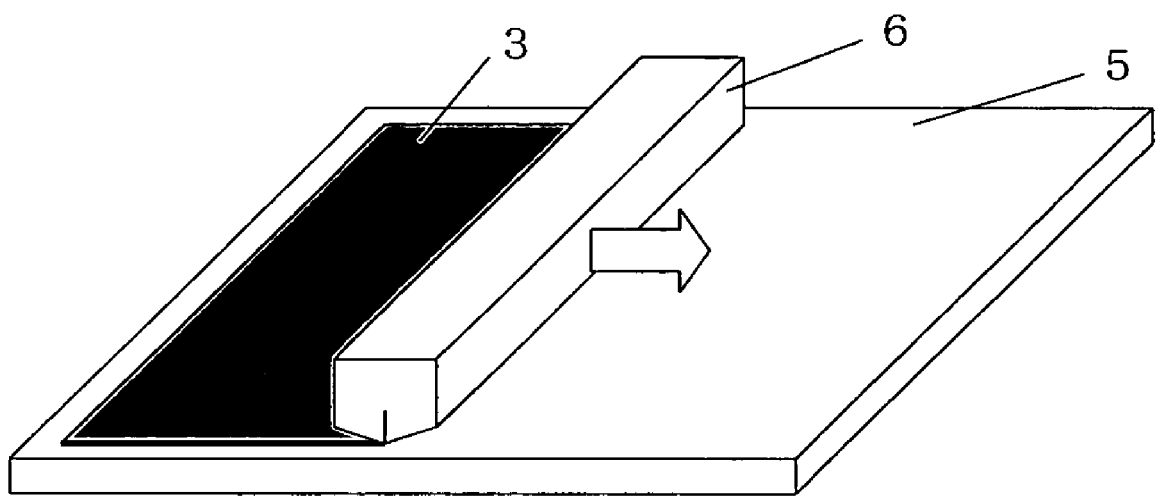
FIG. 3 is a schematic view showing a coating step by a slit die coating method.
Figure 4:
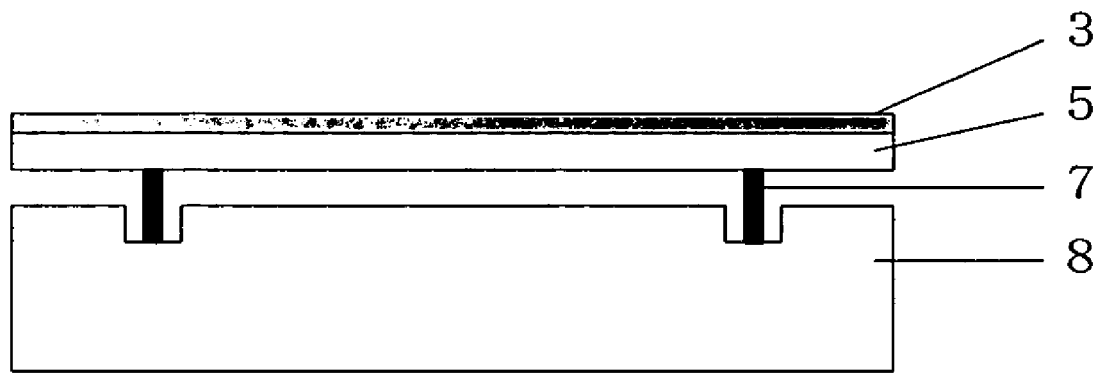
FIG. 4 is a sectional view showing a drying step by a hot plate method.
Figure 5:
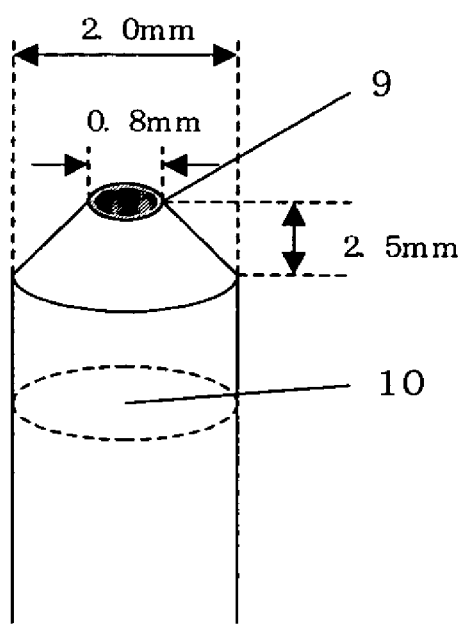
FIG. 5 is a schematic view showing proximity pins.

FIG. 3 is a schematic view showing a coating step by a slit die coating method. FIG. 4 is a sectional view showing a drying step by a hot plate method. FIG. 5 is a schematic view showing proximity pins used in the drying step shown in FIG. 4. The proximity pins had a diameter D of 2.0 mm, a cross-sectional area $S_1$ of 3.1 mm², a contact area $S_2$ with a glass substrate of 0.5 mm² and a height of 10 mm. As the material of the proximity pins, a stainless steel material "SUS304A" was used.

<Process for Evaluation of Photosensitive Resin Film>

The photosensitive resin film obtained by the above process was evaluated by visually observing transcribed trace and line drawing in the substrate after drying, using a fluorescent lamp.

<Process for Calculation of Boiling Point of Organic Solvent>

Boiling points of organic solvents used in example and comparative examples of the present invention were cited from the following documents "CRC Handbook of Chemistry and Physics" and "Aldrich Handbook of Fine Chemical and Laboratory Equipment". Also boiling points of organic solvents which are not described in known documents are measured by using a commercially available boiling point measuring apparatus, for example, FP81HT/FP81C (produced by Mettler Toledo Co., Ltd.).

<Process for Measurement of Weight-average Molecular Weight of the Component (a)>

Weight-average molecular weights of resins used as the component (a) of the present invention were measured by a commercially available gel permeation chromatograph. Using polystyrene standards whose weight-average molecular weight is previously known, a calibration curve was made and the molecular weight was analyzed using the calibration curve. GPC Model 510 (Waters Co., Ltd.) was used as the chromatograph and TSK-GELα2500 and TSK-GELα40000 (produced by Tosoh Co., Ltd.) were used as a column. Furthermore, N-methyl-2-pyrrolidone was used as a developing solution and the measurement was performed at a flow rate of 0.4 ml/min.

Synthesis Example 1

Synthesis of Hydroxy Group-containing Acid Anhydride (a)

In a dry nitrogen gas flow, 18.3 g (0.05 mol) of 2,2-bis(3-amino-4-hydroxyphenyl)hexafluoropropane (BAHF) and 34.2 g (0.3 mol) of allyl glycidyl ether were dissolved in 100 g of γ-butyrolactone, and the solution was cooled to −15° C. A solution of 22.1 g (0.11 mol) of trimellitoyl chloride anhydride in 50 g of γ-butyrolactone was added dropwise in the above solution so as not to increase the temperature of the reaction solution to 0° C. or higher. After the dropwise addition, the mixture was reacted at 0° C. for 4 hours. The resulting solution was concentrated with a rotary evaporator and then poured into 1 liter of toluene to obtain an acid anhydride (a).

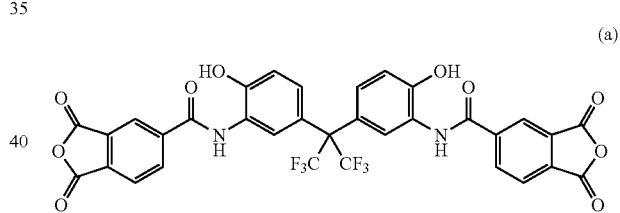

(a)

Synthesis Example 2

Synthesis of Hydroxy Group-containing Diamine Compound (b)

15.4 g (0.1 mol) of 2-amino-4-nitrophenol was dissolved in 50 ml of acetone and 30 g (0.34 mol) of propylene oxide, and the solution was cooled to −15° C. A solution of 23.6 g (0.055 mol) of 2,2-bis-(4-benzoylchloride)hexafluoropropane in 60 ml of acetone was gradually added dropwise in the above solution. After the dropwise addition, the mixture was reacted at −15° C. for 4 hours and heated to room temperature. A precipitate was collected by filtration.

The precipitate was dissolved in 200 ml of γ-butyrolactone and 3 g of 5% palladium-carbon was added, followed by vigorous stirring. Hydrogen gas was introduced into the reaction mixture with a balloon. The mixture was stirred until the balloon became so as not to deflate any more and further stirred for 2 hours with the balloon attached. After stirring, a palladium compound was removed by filtration, and the resulting solution was concentrated to half that volume with a rotary evaporator. The solution was recrystallized from ethanol to obtain crystals of a diamine compound (b).

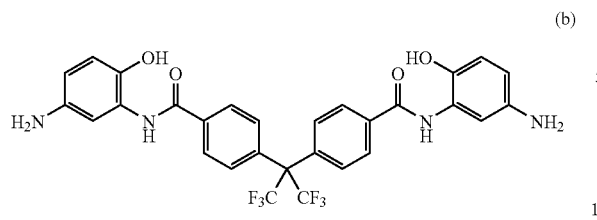

(b)

Synthesis Example 3

Synthesis of Hydroxy Group-containing Diamine Compound (c)

18.3 g (0.05 mol) of BAHF was dissolved in 100 ml of acetone and 17.4 g (0.3 mol) of propylene oxide, and the solution was cooled to −15° C. A solution of 20.4 g (0.11 mol) of 4-nitrobenzoyl chloride in 100 ml of acetone was added dropwise in the above reaction solution. After the dropwise addition, the mixture was reacted at −15° C. for 4 hours and heated to room temperature. A white solid precipitate was separated out by filtration and then vacuum-dried at 50° C.

30 g of the resulting solid was charged in a 300 ml stainless steel autoclave and was dispersed in 250 ml of methyl cellosolve, and then 2 g of 5% palladium-carbon was added. Hydrogen was introduced into the mixture with a balloon and the reduction reaction was performed at room temperature. After 2 hours, it was ensured that the balloon did not reflate any more and the reaction was terminated. After the completion of the reaction, a palladium compound as a catalyst was removed by filtration and the reaction solution was concentrated with a rotary evaporator to obtain a diamine compound (c). The resulting solid was used for reaction as it is.

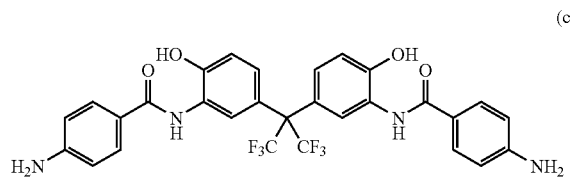

(c)

Synthesis Example 4

Synthesis of Hydroxy Group-containing Diamine Compound (d)

15.4 g (0.1 mol) of 2-amino-4-nitrophenol was dissolved in 100 ml of acetone and 17.4 g (0.3 mol) of propylene oxide, and the solution was cooled to −15° C. A solution of 20.4 g (0.11 mol) of 4-nitrobenzoyl chloride in 100 ml of acetone was gradually added dropwise to the above solution. After the dropwise addition, the mixture was reacted at −15° C. for 4 hours and heated to room temperature. A precipitate was collected by filtration. Then, crystals of a diamine compound (d) were obtained in the same manner as in Synthesis Example 2.

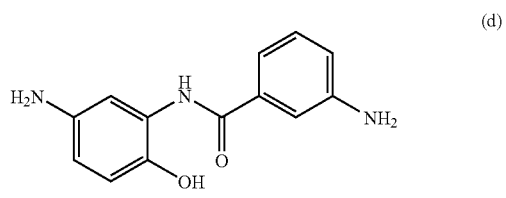

(d)

Synthesis Example 5

Synthesis of 3,3',4,4'-diphenylether-tetracarboxylic acid di-n-butyl ester dichloride Solution (e)

In a dry nitrogen gas flow, 24.82 g (0.08 mol) of 3,3',4,4'-diphenylether-tetracarboxylic dianhydride and 59.3 g (0.8 mol) of n-butyl alcohol were reacted with stirring at 95° C. for 6 hours. Excess n-butyl alcohol was distilled off under reduced pressure to obtain a 3,3',4,4'-diphenylether-tetracarboxylic acid di-n-butyl ester. Then, 95.17 g (0.8 mol) of thionyl chloride and 70 g of tetrahydrofuran (THF) were charged and the mixture was reacted at 40° C. for 3 hours. Subsequently, 200 g of N-methyl pyrrolidone was added and excess thionyl chloride and THF were removed under reduced pressure to obtain 239.6 g (0.08 mol) of a 3,3',4,4'-diphenylether-tetracarboxylic acid di-n-butyl ester dichloride solution (e).

Synthesis Example 6

Synthesis of Quinonediazide Compound (f)

In a dry nitrogen gas flow, 21.23 g (0.05 mol) of TrisP-PA (trade name, produced by Honshu Chemical Industry Co., Ltd.) and 33.58 g (0.125 mol) of 5-naphthoquinonediazidosulfonyl chloride were dissolved in 450 g of 1,4-dioxane, and the solution was brought to room temperature. Then, a mixture of 50 g of 1,4-dioxane and 12.65 g (0.125 mol) of triethylamine was added dropwise in the above solution so as not to increase the temperature in the system to 35° C. or higher. After the dropwise addition, the mixture was stirred at 30° C. for 2 hours. A triethylamine salt was removed by filtration and the filtrate was poured into water. Then, a precipitate was collected by filtration. The precipitate was dried in a vacuum dryer to obtain a quinonediazide compound (f).

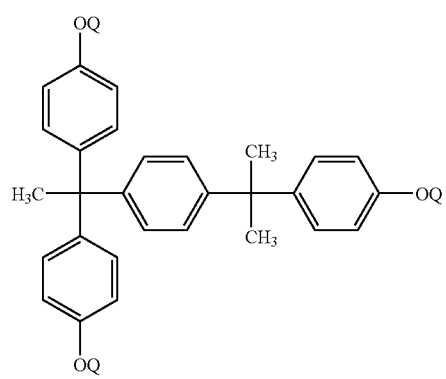

(f)

-continued

Q = 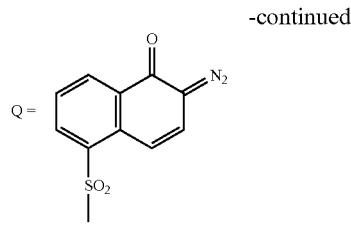

Synthesis Example 7

Synthesis of Quinonediazide Compound (g)

In a dry nitrogen gas flow, 15.31 g (0.05 mol) of TrisP-HAP (trade name, produced by Honshu Chemical Industry Co., Ltd.) and 40.28 g (0.15 mol) of 5-naphthoquinonediazidosulfonyl chloride were dissolved in 450 g of 1,4-dioxane, and the solution was brought to room temperature. Using a mixture of 50 g of 1,4-dioxane and 15.18 g (0.15 mol) of triethylamine, a quinonediazide compound (g) was obtained in the same manner as in Synthesis Example 6.

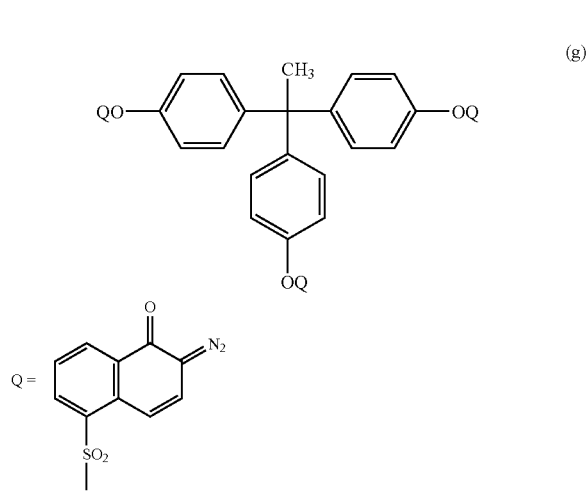

(g)

Synthesis Example 8

Synthesis of Quinonediazide Compound (h)

In a dry nitrogen gas flow, 6.81 g (0.05 mol) of 4-isopropylphenol and 13.43 g (0.05 mol) of 5-naphthoquinonediazidosulfonyl chloride were dissolved in 450 g of 1,4-dioxane, and the solution was brought to room temperature. Using a mixture of 50 g of 1,4-dioxane and 5.06 g of triethylamine, a quinonediazide compound (h) was obtained in the same manner as in Synthesis Example 6.

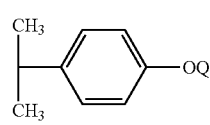

(h)

-continued

Q = 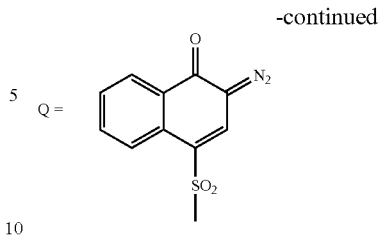

Synthesis Example 9

Synthesis of Quinonediazide Compound (i)

In a dry nitrogen gas flow, 11.41 g (0.05 mol) of bisphenol A and 26.86 g (0.1 mol) of 5-naphthoquinonediazidosulfonyl chloride were dissolved in 450 g of 1,4-dioxane, and the solution was brought to room temperature. Using a mixture of 50 g of 1,4-dioxane and 10.12 g of triethylamine, a quinonediazide compound (i) was obtained in the same manner as in Synthesis Example 6.

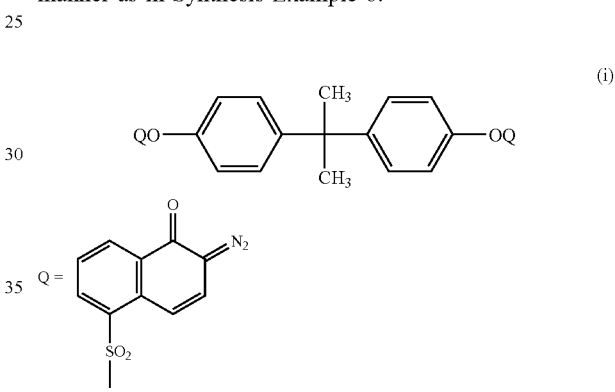

(i)

Synthesis Example 10

Synthesis of Activated Ester Compound (j)

In a dry nitrogen gas flow, 18.5 g (0.1 mol) of 4-carboxybenzoic acid chloride and 13.5 g (0.1 mol) of hydroxybenzotriazole were dissolved in 100 g of tetrahydrofuran (THF), and the solution was cooled to −15° C. A solution of 10.0 g (0.1 mol) of triethylamine in 50 g of THF was added dropwise in the above solution so as not to increase the temperature of the reaction solution to 0° C. or higher. After the dropwise addition, the mixture was reacted at 25° C. for 4 hours. The reaction solution was concentrated with a rotary evaporator to obtain an activated ester compound (j).

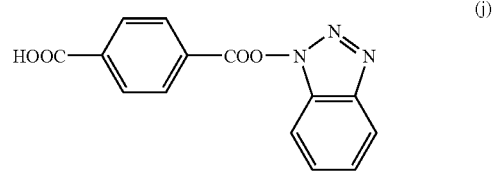

(j)

Example 1

In a dry nitrogen gas flow, 12.01 g (0.02 mol) of the hydroxy group-containing acid anhydride (a) obtained in Synthesis Example 1 was dissolved in 100 g of N-methyl-2-pyrrolidone (NMP). To the solution, 7.2 g (0.012 mol) of the hydroxy group-containing diamine (b) obtained in Synthesis Example 2 and 25 g of NMP were added and the mixture was reacted at 20° C. for one hour, and then reacted at 50° C. for 2 hours. An end cap compound was not added. Then, a solution of 7.15 g (0.06 mol) of N,N-dimethylformamide dimethylacetal in 10 g of NMP was added dropwise over 10 minutes. After the dropwise addition, the mixture was stirred at 50° C. for 3 hours. After the completion of the reaction, the reaction solution was poured into 1 liter of water to precipitate a resin (resin A), which was collected by filtration. The resin A was dried in a vacuum dryer at 80° C. for 40 hours.

10 g of the resin A thus obtained, 1.5 g of the quinonediazide compound (f) obtained in Synthesis Example 6 and 0.3 g of vinylmethoxysilane were dissolved in a solvent mixture of 25 g of propylene glycol monomethyl ether (boiling point: 118–119° C.) and 25 g of γ-butyrolactone (boiling point: 204° C.) to obtain a varnish W1 as a photosensitive polyimide precursor resin composition.

The resulting varnish W1 was applied onto a glass substrate, on which an ITO film having a pattern is formed, by a slit die coating method according to the above method for producing a photosensitive resin film. The coated glass substrate was dried with a hot plate, and then it was evaluated whether or not there is transcribed trace and/or line drawing.

Example 2

In a dry nitrogen gas flow, 12.01 g (0.02 mol) of the hydroxy group-containing acid anhydride (a) obtained in Synthesis Example 1 was dissolved in 100 g of N-methyl-2-pyrrolidone (NMP). To the solution, 9.6 g (0.016 mol) of the hydroxy group-containing diamine (b) obtained in Synthesis Example 2 and 25 g of NMP were added and the mixture was reacted at 20° C. for one hour, and then reacted at 50° C. for 2 hours. Then, 0.87 g (0.008 mol) of 4-aminophenol was added and the mixture was reacted at 50° C. for 2 hours. Furthermore, a solution of 7.15 g (0.06 mol) of N,N-dimethylformamide dimethylacetal in 10 g of NMP was added dropwise over 10 minutes. After the dropwise addition, the mixture was stirred at 50° C. for 3 hours. After the completion of the reaction, the reaction solution was poured into 1 liter of water to precipitate a resin (resin B), which was collected by filtration. The resin B was dried in a vacuum dryer at 80° C. for 40 hours.

10 g of the resin B thus obtained, 1.5 g of the quinonediazide compound (f) obtained in Synthesis Example 6 and 0.3 g of vinylmethoxysilane were dissolved in a solvent mixture of 35 g of propylene glycol monomethyl ether (boiling point: 118–119° C.) and 15 g of γ-butyrolactone (boiling point: 204° C.) to obtain a varnish W2 as a photosensitive polyimide precursor resin composition.

The resulting varnish W2 was applied onto a glass substrate, on which an ITO film having a pattern is formed, by a slit die coating method according to the above method for producing a photosensitive resin film. The coated glass substrate was dried with a hot plate, and then it was evaluated whether or not there is transcribed trace and/or line drawing.

Example 3

In a dry nitrogen gas flow, 12.01 g (0.02 mol) of the hydroxy group-containing acid anhydride (a) obtained in Synthesis Example 1 was dissolved in 100 g of N-methyl-2-pyrrolidone (NMP). To the solution, 4.84 g (0.008 mol) of the hydroxy group-containing diamine (c) obtained in Synthesis Example 3, 1.94 g (0.008 mol) of the hydroxy group-containing diamine (d) obtained in Synthesis Example 4 and 25 g of NMP were added and the mixture was reacted at 20° C. for one hour, and then reacted at 50° C. for 2 hours. Then, 0.94 g (0.008 mol) of 4-ethynylaniline was added and the mixture was reacted at 50° C. for 2 hours. Furthermore, a solution of 7.15 g (0.06 mol) of N,N-dimethylformamide dimethylacetal in 5 g of NMP was added dropwise over 10 minutes. After the dropwise addition, the mixture was stirred at 50° C. for 3 hours. After the completion of the reaction, the solution was poured into 1 liter of water to precipitate a resin (resin C), which was collected by filtration. The resin C was dried in a vacuum dryer at 80° C. for 40 hours.

10 g of the resin C thus obtained, 1.7 g of the quinonediazide compound (g) obtained in Synthesis Example 7 and 0.3 g of vinylmethoxysilane were dissolved in 50 g of ethylene glycol monoethyl ether (boiling point: 135° C.) to obtain a varnish W3 as a photosensitive polyimide precursor resin composition.

The resulting varnish W3 was applied onto a glass substrate, on which an ITO film having a pattern is formed, by a slit die coating method according to the above method for producing a photosensitive resin film. The coated glass substrate was dried with a hot plate, and then it was evaluated whether or not there is transcribed trace and/or line drawing.

Example 4

In a dry nitrogen gas flow, 12.01 g (0.02 mol) of the hydroxy group-containing acid anhydride (a) obtained in Synthesis Example 1 was dissolved in 100 g of N-methyl-2-pyrrolidone (NMP). To the solution, 9.6 g (0.016 mol) of the hydroxy group-containing diamine (b) obtained in Synthesis Example 2 and 25 g of NMP were added and the mixture was reacted at 20° C. for one hour, and then reacted at 50° C. for 2 hours. Then, 0.44 g (0.004 mol) of 4-aminophenol and 0.47 g (0.004 mol) of 4-ethynylaniline were added and the mixture was reacted at 50° C. for 2 hours. Furthermore, a solution of 7.15 g (0.06 mol) of N,N-dimethylformamide dimethylacetal in 10 g of NMP was added dropwise over 10 minutes. After the dropwise addition, the mixture was stirred at 50° C. for 3 hours. After the completion of the reaction, the reaction solution was poured into 1 liter of water to precipitate a resin (resin D), which was collected by filtration. The resin D was dried in a vacuum dryer at 80° C. for 40 hours.

10 g of the resin D thus obtained, 1.5 g of the quinonediazide compound (f) obtained in Synthesis Example 6 and 0.3 g of vinylmethoxysilane were dissolved in a solvent mixture of 30 g of propylene glycol monoethyl ether (boiling point: 132° C.) and 20 g of N-methyl-2-pyrrolidone (boiling point: 202° C.) to obtain a varnish W4 as a photosensitive polyimide precursor resin composition.

The resulting varnish W4 was applied onto a glass substrate, on which an ITO film having a pattern is formed, by a slit die coating method according to the above method for producing a photosensitive resin film. The coated glass substrate was dried with a hot plate, and then it was evaluated whether or not there is transcribed trace and/or line drawing.

Example 5

In a dry nitrogen gas flow, 9.08 g (0.045 mol) of 4,4'-diaminodiphenyl ether and 1.24 g (0.005 mol) of 1,3-bis(3-aminopropyl)tetramethyldisiloxane were dissolved in 20 g of N-methyl-2-pyrrolidone (NMP). To the solution, 24.02 g (0.04 mol) of the hydroxy group-containing acid dianhydride (a) obtained in Synthesis Example 1 and 15 g of NMP were added and the mixture was reacted at 20° C. for one hour, and then reacted at 50° C. for 2 hours. After the reaction, 1.96 g (0.02 mol) of maleic anhydride as an end cap compound was added and the mixture was reacted at 50° C. for 2 hours. Furthermore, a solution of 15.19 g (0.127 mol) of N,N-dimethylformamide dimethylacetal in 4 g of NMP was added dropwise over 10 minutes. After the dropwise addition, the mixture was stirred at 50° C. for 3 hours. After the completion of the reaction, the solution was poured into 1 liter of water to precipitate a resin (resin E), which was collected by filtration. The resin E was dried in a vacuum dryer at 70° C. for 60 hours.

10 g of the resin E thus obtained, 1.1 g of the quinonediazide compound (h) obtained in Synthesis Example 8 and 0.2 g of vinylmethoxysilane were dissolved in a solvent mixture of 30 g of butyl acetate (boiling point: 126° C.) and 20 g of γ-butyrolactone (boiling point: 204° C.) to obtain a varnish W5 as a photosensitive polyimide precursor resin composition.

The resulting varnish W5 was applied onto a glass substrate, on which an ITO film having a pattern is formed, by a slit die coating method according to the above method for producing a photosensitive resin film. The coated glass substrate was dried with a hot plate, and then it was evaluated whether or not there is transcribed trace and/or line drawing.

Example 6

In a dry nitrogen gas flow, 9.67 g (0.016 mol) of the hydroxy group-containing diamine compound (c) obtained in Synthesis Example 3, 0.50 g (0.002 mol) of 1,3-bis(3-aminopropyl)tetramethyldisiloxane and 0.44 g (0.004 mol) of 3-aminophenol as an end cap compound were dissolved in 50 g of N-methyl-2-pyrrolidone (NMP). To the solution, 6.2 g (0.02 mol) of bis(3,4-dicarboxyphenyl)ether dianhydride and 14 g of NMP were added and the mixture was reacted at 20° C. for one hour, and then reacted at 50° C. for 4 hours. Then, a solution of 7.15 g (0.06 mol) of N,N-dimethylformamide dimethylacetal in 5 g of NMP was added dropwise over 10 minutes. After the dropwise addition, the mixture was stirred at 50° C. for 3 hours. After the completion of the reaction, the solution was poured into 1 liter of water to precipitate a resin (resin F), which was collected by filtration. The resin F was dried in a vacuum dryer at 70° C. for 60 hours.

10 g of the resin F thus obtained, 2.0 g of the quinonediazide compound (i) obtained in Synthesis Example 9 and 1.0 g of TrisP-PA (trade name, produced by Honshu Chemical Industry Co., Ltd.) as a compound having a phenolic hydroxy group were dissolved in a solvent mixture of 45 g of propylene glycol monomethyl ether (boiling point: 118–119° C.) and 5 g of γ-butyrolactone (boiling point: 204° C.) to obtain a varnish W6 as a photosensitive polyimide precursor resin composition.

The resulting varnish W6 was applied onto a glass substrate, on which an ITO film having a pattern is formed, by a slit die coating method according to the above method for producing a photosensitive resin film. The coated glass substrate was dried with a hot plate, and then it was evaluated whether or not there is transcribed trace and/or line drawing.

Example 7

In a dry nitrogen gas flow, 9.67 g (0.016 mol) of the hydroxy group-containing diamine compound (c) obtained in Synthesis Example 3 and 0.50 g (0.002 mol) of 1,3-bis(3-aminopropyl)tetramethyldisiloxane were dissolved in 50 g of N-methyl-2-pyrrolidone (NMP). To the solution, 6.2 g (0.02 mol) of bis(3,4-dicarboxyphenyl)ether dianhydride and 14 g of NMP were added and the mixture was reacted at 20° C. for one hour, and then reacted at 50° C. for 2 hours. Then, 0.47 g (0.004 mol) of 4-ethynylaniline as an end cap compound was added and the mixture was reacted at 50° C. for 2 hours. Furthermore, a solution of 4.77 g (0.04 mol) of N,N-dimethylformamide dimethylacetal in 5 g of NMP was added dropwise over 10 minutes. After the dropwise addition, the mixture was stirred at 50° C. for 3 hours. After the completion of the reaction, the solution was poured into 1 liter of water to precipitate a resin (resin G), which was collected by filtration. The resin G was dried in a vacuum dryer at 70° C. for 60 hours.

10 g of the resin G thus obtained, 2.0 g of the naphthoquinonediazide compound (f) obtained in Synthesis Example 6, 1.5 g of TrisP-HAP (trade name, produced by Honshu Chemical Industry Co., Ltd.) as a compound having a phenolic hydroxy group and 0.3 g of vinylmethoxysilane were dissolved in a solvent mixture of 35 g of propylene glycol monomethyl ether (boiling point: 118–119° C.), 10 g of ethyl lactate (boiling point: 154° C.) and 5 g of γ-butyrolactone (boiling point: 204° C.) to obtain a varnish W7 as a photosensitive polyimide precursor resin composition.

The resulting varnish W7 was applied onto a glass substrate, on which an ITO film having a pattern is formed, by a slit die coating method according to the above method for producing a photosensitive resin film. The coated glass substrate was dried with a hot plate, and then it was evaluated whether or not there is transcribed trace and/or line drawing.

Example 8

In a dry nitrogen gas flow, 6.2 g (0.02 mol) of bis(3,4-dicarboxyphenyl)ether dianhydride was dissolved in 50 g of N-methyl-2-pyrrolidone (NMP). To the solution, 1.09 g (0.01 mol) of 3-aminophenol as an end cap compound was added and the mixture was reacted at 40° C. for one hour. Then, 6.04 g (0.01 mol) of the hydroxy group-containing diamine compound (c) obtained in Synthesis Example 3, 1 g (0.005 mol) of 4,4'-diaminodiphenyl ether and 10 g of NMP were added and the mixture was reacted at 40° C. for 2 hours. Furthermore, a solution of 5.96 g (0.05 mol) of N,N-dimethylformamide dimethylacetal in 5 g of NMP was added dropwise over 10 minutes. After the dropwise addition, the mixture was stirred at 50° C. for 3 hours. After the completion of the reaction, the solution was poured into 1 liter of water to precipitate a resin (resin H), which was collected by filtration. The resin H was dried in a vacuum dryer at 70° C. for 60 hours.

10 g of the resin H thus obtained, 3.0 g of the naphthoquinonediazide compound (f) obtained in Synthesis Example 6 and 0.3 g of vinylmethoxysilane were dissolved in a solvent mixture of 15 g of methyl propyl ketone (boiling point: 102° C.), 15 g of propylene glycol monomethyl ether (boiling point: 118–119° C.) and 20 g of N,N-dimethylacetamide (boiling point: 165° C.) to obtain a varnish W8 as a photosensitive polyimide precursor resin composition.

The resulting varnish W8 was applied onto a glass substrate, on which an ITO film having a pattern is formed, by a slit die coating method according to the above method for producing a photosensitive resin film. The coated glass substrate was dried with a hot plate, and then it was evaluated whether or not there is transcribed trace and/or line drawing.

Example 9

In a dry nitrogen gas flow, 27.47 g (0.075 mol) of 2,2-bis(3-amino-4-hydroxyphenyl)hexafluoropropane, 1.24 g (0.005 mol) of 1,3-bis(3-aminopropyl)tetramethyldisiloxane, 5.66 g (0.02 mol) of the activated ester compound (j) as an end cap compound and 11.93 g (0.151 mol) of pyridine were dissolved in 50 g of N-methyl-2-pyrrolidone (NMP). To the solution, 239.6 g (0.08 mol) of a 3,3',4,4'-diphenylether-tetracarboxylic acid di-n-butyl ester dichloride solution (e) was added dropwise so as not to increase the temperature in the system to 10° C. or higher. After the dropwise addition, the mixture was stirred at room temperature for 6 hours. After the completion of the reaction, the reaction solution was poured into 2 liters of water to precipitate a resin (resin I), which was collected by filtration. The resin I was dried in a vacuum dryer at 80° C. for 20 hours.

10 g of the resin I thus obtained, 2.5 g of the naphthoquinonediazide compound (f) obtained in Synthesis Example 6 and 0.3 g of vinylmethoxysilane were dissolved in a solvent mixture of 25 g of ethylene glycol monoethyl ether (boiling point: 135° C.), 10 g of ethyl lactate (boiling point: 154° C.) and 15 g of NMP (boiling point: 202° C.) to obtain a varnish W9 as a photosensitive polyimide precursor resin composition.

The resulting varnish W9 was applied onto a glass substrate, on which an ITO film having a pattern is formed, by a slit die coating method according to the above method for producing a photosensitive resin film. The coated glass substrate was dried with a hot plate, and then it was evaluated whether or not there is transcribed trace and/or line drawing.

Example 10

In a dry nitrogen gas flow, 7.75 g (0.051 mol) of 3,5-diaminobenzoic acid, 4 g (0.02 mol) of 4,4'-diaminodiphenyl ether, 1.96 g (0.018 mol) of 3-aminophenol as an end cap compound and 12.66 g (0.16 mol) of pyridine were dissolved in 50 g of N-methyl-2-pyrrolidone (NMP). To the solution, 48.04 g (0.08 mol) of the hydroxy group-containing acid anhydride (a) obtained in Synthesis Example 1 and 50 g of NMP were added and the mixture was reacted at 40° C. for 2 hours. Then, a solution of 11.92 g (0.1 mol) of N,N-dimethylformamide dimethylacetal in 10 g of NMP was added dropwise over 10 minutes. After the dropwise addition, the mixture was stirred at 50° C. for 3 hours. After the completion of the reaction, the solution was poured into 2 liters of water to precipitate a resin (resin J), which was collected by filtration. The resin J was dried in a vacuum dryer at 80° C. for 20 hours.

10 g of the resin J thus obtained, 2.2 g of the naphthoquinonediazide compound (g) obtained in Synthesis Example 7 and 0.3 g of vinyltrimethoxysilane were dissolved in a solvent mixture of 25 g of propylene glycol monomethyl ether (boiling point: 118–119° C.) and 25 g of γ-butyrolactone (boiling point: 204° C.) to obtain a varnish W10 as a photosensitive polyimide precursor resin composition.

The resulting varnish W10 was applied onto a glass substrate, on which an ITO film having a pattern is formed, by a slit die coating method according to the above method for producing a photosensitive resin film. The coated glass substrate was dried with a hot plate, and then it was evaluated whether or not there is transcribed trace and/or line drawing.

Example 11

In a dry nitrogen gas flow, 7.75 g (0.051 mol) of 3,5-diaminobenzoic acid, 7.3 g (0.02 mol) of 2,2-bis(3-amino-4-hydroxyphenyl)hexafluoropropane, 1.96 g (0.018 mol) of 3-aminophenol as an end cap compound and 12.66 g (0.16 mol) of pyridine were dissolved in 50 g of N-methyl-2-pyrrolidone (NMP). To the solution, 239.6 g (0.08 mol) of a 3,3',4,4'-diphenylether-tetracarboxylic acid di-n-butyl ester dichloride solution (e) was added dropwise so as not to increase the temperature in the system to 10° C. or higher. After the dropwise addition, the mixture was stirred at room temperature for 6 hours. After the completion of the reaction, the reaction solution was poured into 2 liters of water to precipitate a resin (resin K), which was collected by filtration. The resin K was dried in a vacuum dryer at 80° C. for 20 hours.

10 g of the resin K thus obtained, 2.2 g of the naphthoquinonediazide compound (g) obtained in Synthesis Example 7 and 0.3 g of vinyltrimethoxysilane were dissolved in a solvent mixture of 25 g of methyl propyl ketone (boiling point: 102° C.) and 25 g of γ-butyrolactone (boiling point: 204° C.) to obtain a varnish W11 as a photosensitive polyimide precursor resin composition.

The resulting varnish W11 was applied onto a glass substrate, on which an ITO film having a pattern is formed, by a slit die coating method according to the above method for producing a photosensitive resin film. The coated glass substrate was dried with a hot plate, and then it was evaluated whether or not there is transcribed trace and/or line drawing.

Example 12

In a dry nitrogen gas flow, 124 g (0.4 mol) of bis(3,4-dicarboxyphenyl)ether dianhydride, 52 g (0.4 mol) of 2-hydroxyethylmethacrylate, 18.4 g (0.4 mol) of ethanol and 320 g of γ-BL were charged and, under ice cooling, 64.2 g of pyridine was added while stirring. After the completion of heat generation, the mixture was air-cooled to room temperature and then allowed to stand for 16 hours. Under ice cooling, a solution of 166 g of dicyclohexylcarbodiimide in 120 g of γ-BL was added while stirring over 40 minutes. Subsequently, a suspension of 181 g (0.3 mol) of the hydroxy group-containing diamine compound (c) obtained in Synthesis Example 3 in 150 g of γ-BL was added while stirring over 60 minutes. After stirring at room temperature for 2 hours, 30 g of ethanol was added, followed by stirring for one hour. 250 g of N,N-dimethylacetamide (DMAc) and 400 g of tetrahydrofuran were added and a precipitate was removed by filtration. The resulting reaction solution was added to 15 liters of ethanol, and then a precipitate (resin L) was separated out and vacuum-dried.

10 g of the resin L thus obtained, 1 g of methyl o-benzoylbenzoate and 2.2 g of ethylene glycol diacrylate were dissolved in a solvent mixture of 40 g of propylene glycol monomethyl ether (boiling point: 118–119° C.) and 10 g of N-methyl-2-pyrrolidone (boiling point: 202° C.) to obtain a varnish W12 as a negative photosensitive polyimide precursor resin composition.

The resulting varnish W12 was applied onto a glass substrate, on which an ITO film having a pattern is formed, by a slit die coating method according to the above method for producing a photosensitive resin film. The coated glass substrate was dried with a hot plate, and then it was evaluated whether or not there is transcribed trace and/or line drawing.

Example 13

The varnish W1 obtained in Example 1 was applied onto a glass substrate, on which an ITO film having a pattern is formed, by a spin coating method according to the above method for producing a photosensitive resin film. The coating was performed at a rotational speed of 1000 rpm for 10 seconds. The coated glass substrate was dried with a hot plate, and then it was evaluated whether or not there is transcribed trace and/or line drawing.

Example 14

The varnish W7 obtained in Example 7 was applied onto a glass substrate, on which an ITO film having a pattern is formed, by a slit die coating method according to the above method and subsequently the substrate was spun according to a spin coating method for producing a photosensitive resin film. The coating was performed at a rotational speed of 1200 rpm for 6 seconds. The coated glass substrate was dried with a hot plate, and then it was evaluated whether or not there is transcribed trace and/or line drawing.

Example 15

The photosensitive polyimide precursor resin film obtained in Example 1 was exposed to UV rays through a photomask having a shape for covering edges of a first electrode. After exposure, the photosensitive polyimide precursor resin film was developed by dissolving only the exposed area with an aqueous 2.38% TMAH solution, and then rinsed with pure water. Subsequently, the photosensitive polyimide precursor resin film was cured by heating under a nitrogen atmosphere in a clean oven at 230° C. for 30 minutes to obtain a polyimide insulating layer. The insulating layer had a thickness of about 1 µm. The insulating layer is formed so as to cover edges of a first electrode and is provided with an opening having a width of 70 µm and a length of 250 µm at the center, where the first electrode is exposed. The insulating layer has a smooth forward tapered cross-sectional shape.

On the substrate on which this insulating layer was formed, a hole transfer layer, a luminescent layer, and an aluminum layer which serves as a second electrode were sequentially formed by a vacuum deposition method according to a resistance heating system. The hole transfer layer was deposited on the entire effective area of the substrate. The luminescent layer was formed by patterning on a striped first electrode through a shadow mask. The second electrode was formed by striped patterning so as to perpendicularly intersect with the first electrode.

The resulting substrate was taken out from a deposition equipment and then sealed by laminating with a sealing glass plate using an ultraviolet curable epoxy resin. In such a manner, a passive matrix type color organic electroluminescent display was produced. Line-sequential driving of this display unit was performed. As a result, good display characteristics could be obtained. Since the film was smoothly formed without causing thinning or separation of a thin film layer and a second electrode at the boundary portion of the insulating layer, luminescent degradation was not recognized in the luminescent region and thus stable light emission was attained.

Example 16

In the same manner as in Example 15, except that the photosensitive polyimide precursor resin film obtained in Example 2 was used and curing was performed at 230° C. for 60 minutes, a passive matrix type color organic electroluminescent display was produced. Line-sequential driving of this display unit was performed. As a result, luminescent degradation was not recognized and good display characteristics could be obtained.

Example 17

In the same manner as in Example 15, except that the photosensitive polyimide precursor resin film obtained in Example 3 was used and curing was performed at 230° C. for 30 minutes, a passive matrix type color organic electroluminescent display was produced. Line-sequential driving of this display unit was performed. As a result, luminescent degradation was not recognized and good display characteristics could be obtained.

Example 18

In the same manner as in Example 15, except that the photosensitive polyimide precursor resin film obtained in Example 4 was used and curing was performed at 250° C. for 30 minutes, a passive matrix type color organic electroluminescent display was produced. Line-sequential driving of this display unit was performed. As a result, luminescent degradation was not recognized and good display characteristics could be obtained.

Example 19

In the same manner as in Example 15, except that the photosensitive polyimide precursor resin film obtained in Example 5 was used and curing was performed at 230° C. for 30 minutes, a passive matrix type color organic electroluminescent display was produced. Line-sequential driving of this display unit was performed. As a result, luminescent degradation was not recognized and good display characteristics could be obtained.

Example 20

In the same manner as in Example 15, except that the photosensitive polyimide precursor resin film obtained in Example 6 was used and curing was performed at 200° C. for 60 minutes, a passive matrix type color organic electroluminescent display was produced. Line-sequential driving of this display unit was performed. As a result, luminescent degradation was not recognized and good display characteristics could be obtained.

Example 21

In the same manner as in Example 15, except that the photosensitive polyimide precursor resin film obtained in Example 7 was used and curing was performed at 350° C. for 30 minutes, a passive matrix type color organic electroluminescent display was produced. Line-sequential driving of this display unit was performed. As a result, luminescent degradation was not recognized and good display characteristics could be obtained.

Example 22

In the same manner as in Example 15, except that the photosensitive polyimide precursor resin film obtained in Example 8 was used and curing was performed at 200° C. for 30 minutes, a passive matrix type color organic electroluminescent display was produced. Line-sequential driving of this display unit was performed. As a result, luminescent degradation was not recognized and good display characteristics could be obtained.

Example 23

In the same manner as in Example 15, except that the photosensitive polyimide precursor resin film obtained in Example 9 was used and curing was performed at 320° C. for 30 minutes, a passive matrix type color organic electroluminescent display was produced. Line-sequential driving of this display unit was performed. As a result, luminescent degradation was not recognized and good display characteristics could be obtained.

Comparative Example 1

In the same manner as in Example 1, except that the solvent used to prepare a varnish was replaced by a solvent mixture of 15 g of propylene glycol monomethyl ether (boiling point: 118–119° C.) and 35 g of γ-butyrolactone (boiling point: 204° C.), a photosensitive polyimide precursor resin film was formed on a glass substrate on which an ITO film having a pattern is formed, and then it was evaluated whether or not there is transcribed trace and/or line drawing.

Comparative Example 2

In the same manner as in Example 2, except that the solvent used to prepare a varnish was replaced by a solvent mixture of 10 g of propylene glycol monomethyl ether (boiling point: 118–119° C.) and 40 g of γ-butyrolactone (boiling point: 204° C.), a photosensitive polyimide precursor resin film was formed on a glass substrate on which an ITO film having a pattern is formed, and then it was evaluated whether or not there is transcribed trace and/or line drawing.

Comparative Example 3

In the same manner as in Example 3, except that the solvent used to prepare a varnish was replaced by a solvent mixture of 20 g of ethylene glycol monomethyl ether (boiling point: 135° C.) and 30 g of NMP (boiling point: 202° C.), a photosensitive polyimide precursor resin film was formed on a glass substrate on which an ITO film having a pattern is formed, and then it was evaluated whether or not there is transcribed trace and/or line drawing.

Comparative Example 4

In the same manner as in Example 5, except that the solvent used to prepare a varnish was replaced by a solvent mixture of 15 g of butyl acetate (boiling point: 126° C.) and 35 g of γ-butyrolactone (boiling point: 204° C.), a photosensitive polyimide precursor resin film was formed on a glass substrate on which an ITO film having a pattern is formed, and then it was evaluated whether or not there is transcribed trace and/or line drawing.

Comparative Example 5

In the same manner as in Example 6, except that the solvent used to prepare a varnish was replaced by a solvent mixture of 15 g of propylene glycol monomethyl ether (boiling point: 118–119° C.), 30 g of γ-butyrolactone and 5 g of ethyl lactate (boiling point: 154° C.), a photosensitive polyimide precursor resin film was formed on a glass substrate on which an ITO film having a pattern is formed, and then it was evaluated whether or not there is transcribed trace and/or line drawing.

Comparative Example 6

In the same manner as in Example 7, except that the solvent used to prepare a varnish was replaced by a solvent mixture of 17 g of butyl lactate (boiling point: 185–187° C.) and 33 g of γ-butyrolactone, a photosensitive polyimide precursor resin film was formed on a glass substrate on which an ITO film having a pattern is formed, and then it was evaluated whether or not there is transcribed trace and/or line drawing.

Comparative Example 7

In the same manner as in Example 8, except that the solvent used to prepare a varnish was replaced by a solvent mixture of 5 g of propylene glycol monomethyl ether (boiling point: 118–119° C.) and 45 g of ethyl lactate (boiling point: 154° C.), a photosensitive polyimide precursor resin film was formed on a glass substrate on which an ITO film having a pattern is formed, and then it was evaluated whether or not there is transcribed trace and/or line drawing.

Comparative Example 8

In the same manner as in Example 9, except that the solvent used to prepare a varnish was replaced by a solvent mixture of 10 g of ethyl lactate (boiling point: 154° C.) and 40 g of NMP (boiling point: 202° C.), a photosensitive polyimide precursor resin film was formed on a glass substrate on which an ITO film having a pattern is formed, and then it was evaluated whether or not there is transcribed trace and/or line drawing.

Comparative Example 9

In the same manner as in Example 10, except that the solvent used to prepare a varnish was replaced by 50 g of γ-butyrolactone (boiling point: 204° C.), a photosensitive polyimide precursor resin film was formed on a glass substrate on which an ITO film having a pattern is formed, and then it was evaluated whether or not there is transcribed trace and/or line drawing.

Comparative Example 10

In the same manner as in Example 1, except that the solvent used to prepare a varnish was replaced by a solvent mixture of 30 g of propylene glycol monomethyl ether (boiling point: 118–119° C.) and 20 g of ethylene glycol dimethyl ether (boiling point: 85° C.), a photosensitive polyimide precursor resin film was formed on a glass substrate on which an ITO film having a pattern is formed, and then it was evaluated whether or not there is transcribed trace and/or line drawing.

Comparative Example 11

In the same manner as in Example 5, except that the solvent used to prepare a varnish was replaced by a solvent mixture of 35 g of methyl ethyl ketone (boiling point: 80° C.) and 15 g of γ-butyrolactone (boiling point: 204° C.), a photosensitive polyimide precursor resin film was formed on a glass substrate on which an ITO film having a pattern is formed, and then it was evaluated whether or not there is transcribed trace and/or line drawing.

The monomer components of the resins A to L are shown in Table 1 and the evaluation results of Examples 1 to 14 and Comparative Examples 1 to 11 are shown in Table 2. In Table 1, when using a plurality of components, p, q, r and s were expressed by an average.

TABLE 1-1

| Resin | Acid component: R1 |
|---|---|

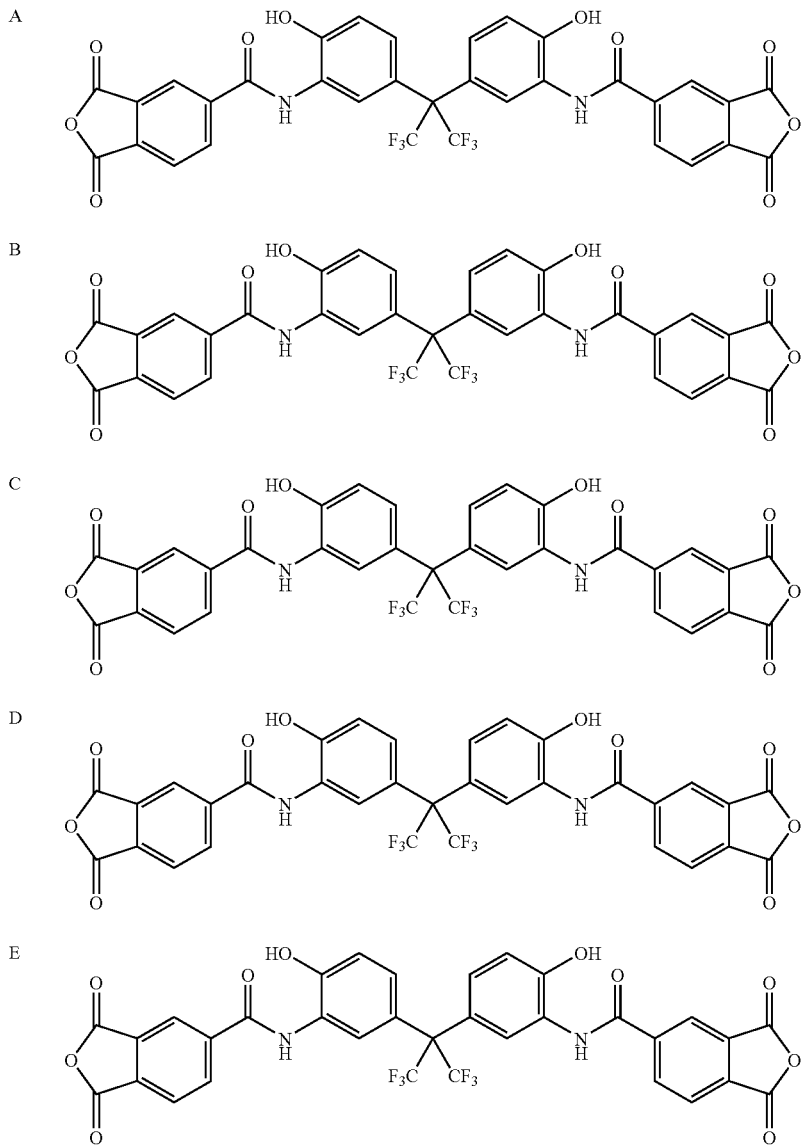

TABLE 1-1-continued
F 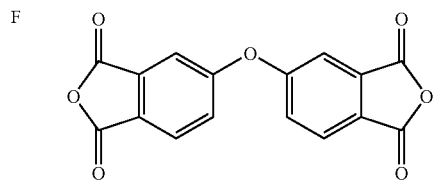
G 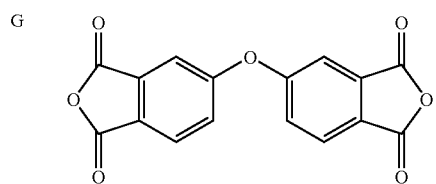
H 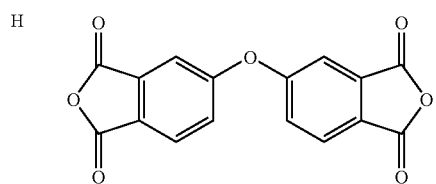
I 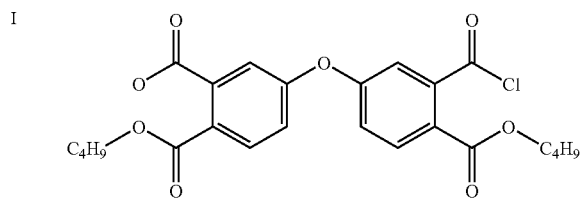
J 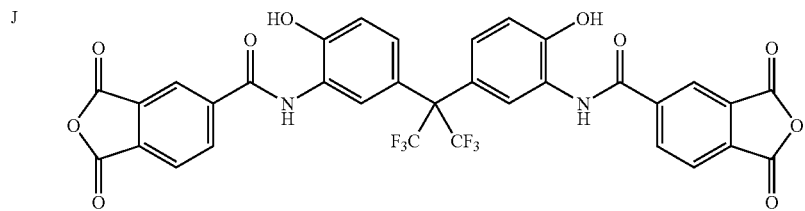
K 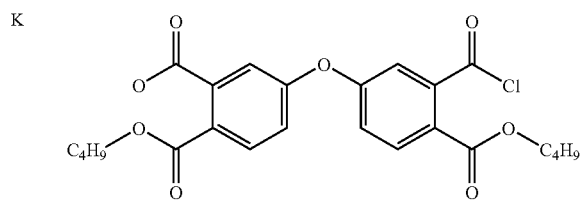

TABLE 1-1-continued
| L | 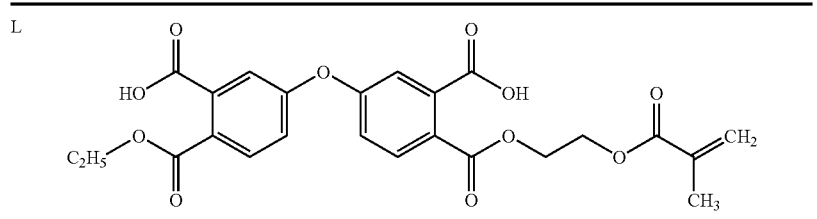 |
|---|---|
| Resin | Amine component: R2 |
| A | 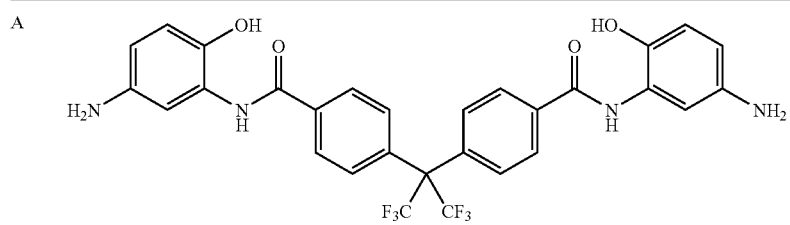 |
| B | 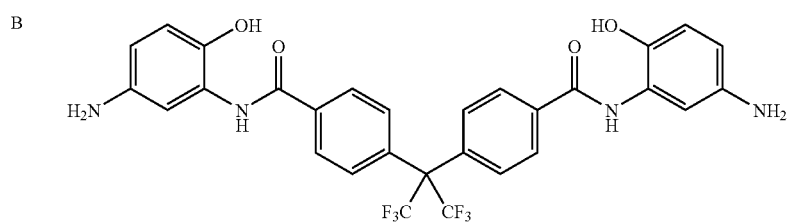 |
| C | 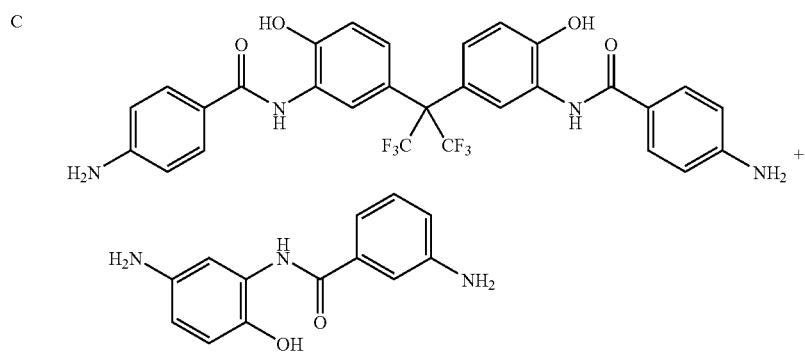 |
| D | 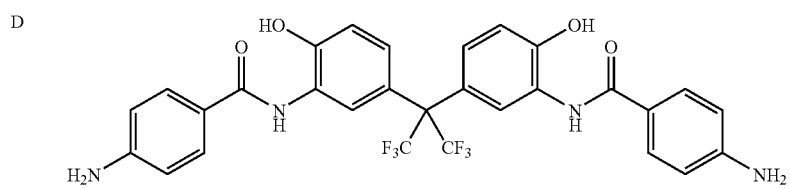 |
| E | 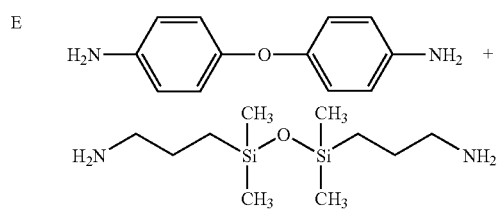 |

TABLE 1-1-continued
F
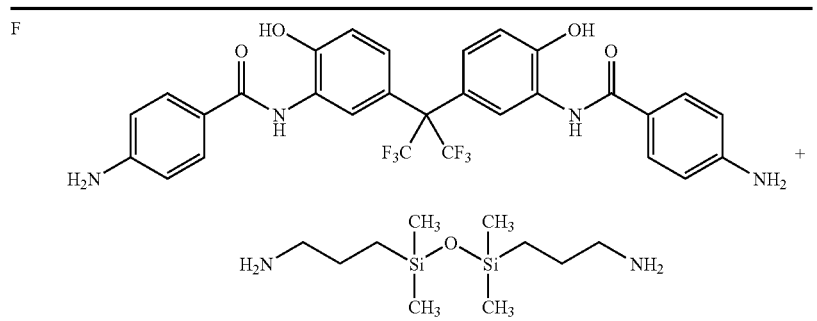
G
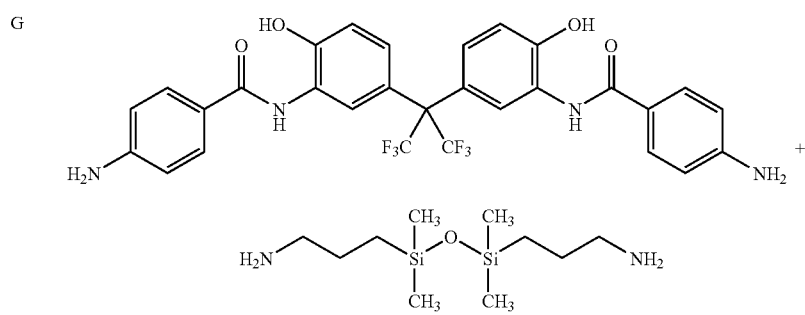
H
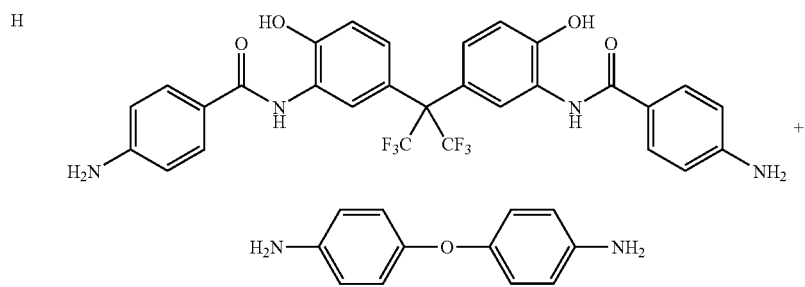
I
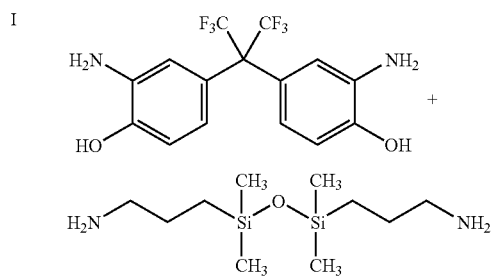
J
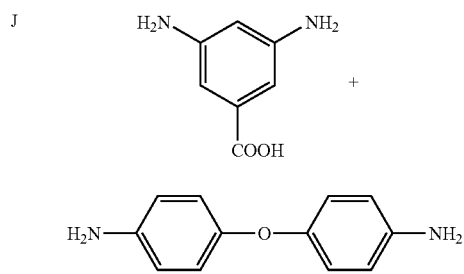

TABLE 1-1-continued

| Resin | End cap compound |
|---|---|
| K | 3,5-diaminobenzoic acid + 2,2-bis(3-amino-4-hydroxyphenyl)hexafluoropropane |
| L | N,N'-bis(4-aminobenzoyl) derivative of 2,2-bis(3-amino-4-hydroxyphenyl)hexafluoropropane |
| A | none |
| B | 4-aminophenol (H₂N—C₆H₄—OH) |
| C | 4-aminophenylacetylene (H₂N—C₆H₄—C≡CH) |
| D | 4-aminophenylacetylene + 4-aminophenol |
| E | maleic anhydride |
| F | 3-aminophenol |
| G | 4-aminophenylacetylene |
| H | 3-aminophenol |

TABLE 1-1-continued

I 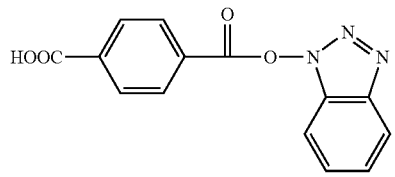

J 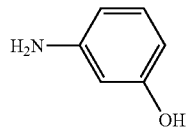

K 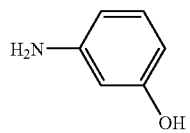

L none

TABLE 1-2

| Resin | Molar ratio (Acid component:Amine component:End cap compound) | p | q | r | s | n | R3 | R4 |
|---|---|---|---|---|---|---|---|---|
| A | 100:60:0 | 2 | 2 | 2 | 0 | about 15 | H or —$CH_3$ | none |
| B | 100:80:40 | 2 | 2 | 2 | 0 | about 25 | H or —$CH_3$ | none |
| C | 100:40 + 40:40 | 2 | 1.5 | 2 | 0 | about 25 | H or —$CH_3$ | none |
| D | 100:80:20 + 20 | 2 | 2 | 2 | 0 | about 25 | H or —$CH_3$ | none |
| E | 80:95 + 5:40 | 2 | 0 | 2 | 0 | about 40 | H or —$CH_3$ | none |
| F | 100:80 + 10:20 | 0 | 1.78 | 2 | 0 | about 30 | H or —$CH_3$ | none |
| G | 100:80 + 10:20 | 0 | 1.78 | 2 | 0 | about 30 | H or —$CH_3$ | none |
| H | 100:50 + 25:50 | 0 | 1.33 | 2 | 0 | about 30 | H or —$CH_3$ | none |
| I | 80:75 + 5:20 | 0 | 1.88 | 2 | 0 | about 35 | —$C_4H_9$ | none |
| J | 80:51 + 20:18 | 2 | 0 | 2 | 0 | about 60 | H or —$CH_3$ | none |
| K | 80:51 + 20:18 | 0 | 0.56 | 2 | 0.72 | about 50 | —$C_4H_9$ | H or none |
| L | 100:75:0 | 0 | 2 | 2 | 0 | about 20 | —$C_2H_5$ or —$CH_2CH_2OC(O)C(CH_3)=CH_2$ | none |

TABLE 2

| | Component (a) Resin | Solvent 100° C. or higher and 140° C. or lower | Solvent 141° C. or higher | Solvent lower than 100° C. | Presence of transcribed trace | Presence of line drawing |
|---|---|---|---|---|---|---|
| Example 1 | A | Propylene glycol monomethyl ether (118–119° C.) 50% | γ-butyrolactone (204° C.) 50% | none | none | none |
| Example 2 | B | Propylene glycol monomethyl ether (118–119° C.) 70% | γ-butyrolactone (204° C.) 30% | none | none | none |
| Example 3 | C | Ethylene glycol monomethyl ether (135° C.) 100% | none | none | none | none |
| Example 4 | D | Propylene glycol monoethyl ether (132° C.) 60% | N-methyl-2-pyrrolidone (202° C.) 40% | none | none | none |
| Example 5 | E | Butyl acetate (126° C.) 60% | γ-butyrolactone (204° C.) 40% | none | none | none |
| Example 6 | F | Propylene glycol monomethyl ether (118–119° C.) 90% | γ-butyrolactone (204° C.) 10% | none | none | none |

TABLE 2-continued

| | Component (a) Resin | Solvent 100° C. or higher and 140° C. or lower | Solvent 141° C. or higher | Solvent lower than 100° C. | Presence of transcribed trace | Presence of line drawing |
|---|---|---|---|---|---|---|
| Example 7 | G | Propylene glycol monomethyl ether (118–119° C.) 70% | Ethyl lactate (154° C.) 20% γ-butyrolactone (204° C.) 10% | none | none | none |
| Example 8 | H | Methyl propyl ketone (102° C.) 30% Propylene glycol monomethyl ether (118–119° C.) 30% | N,N-dimethylacetamide (166° C.) 40% | none | none | none |
| Example 9 | I | Ethylene glycol monomethyl ether (135° C.) 50% | Ethyl lactate (154° C.) 20% N-methyl-2-pyrrolidone (202° C.) 30% | none | none | none |
| Example 10 | J | Propylene glycol monomethyl ether (118–119° C.) 50% | γ-butyrolactone (204° C.) 50% | none | none | none |
| Example 11 | K | Methyl propyl ketone (102° C.) 50% | γ-butyrolactone (204° C.) 50% | none | none | none |
| Example 12 | L | Propylene glycol monomethyl ether (118–119° C.) 80% | N-methyl-2-pyrrolidone (202° C.) 20% | none | none | none |
| Example 13 | A | Propylene glycol monomethyl ether (118–119° C.) 50% | γ-butyrolactone (204° C.) 50% | none | none | none |
| Example 14 | G | Propylene glycol monomethyl ether (118–119° C.) 70% | Ethyl lactate (154° C.) 20% γ-butyrolactone (204° C.) 10% | none | none | none |
| Comparative Example 1 | A | Propylene glycol monomethyl ether (118–119° C.) 30% | γ-butyrolactone (204° C.) 70% | none | observed | none |
| Comparative Example 2 | B | Propylene glycol monomethyl ether (118–119° C.) 20% | γ-butyrolactone (204° C.) 80% | none | observed | none |
| Comparative Example 3 | C | Ethylene glycol monomethyl ether (135° C.) 40% | N-methyl-2-pyrrolidone (202° C.) 60% | none | observed | none |
| Comparative Example 4 | E | Butyl acetate (126° C.) 30% | γ-butyrolactone (204° C.) 70% | none | observed | none |
| Comparative Example 5 | F | Propylene glycol monomethyl ether (118–119° C.) 30% | Ethyl lactate (154° C.) 10% γ-butyrolactone (204° C.) 60% | none | observed | none |
| Comparative Example 6 | G | none | Butyl lactate (185–187° C.) 33% N-methyl-2-pyrrolidone (202° C.) 67% | none | observed | none |
| Comparative Example 7 | H | Propylene glycol monomethyl ether (118–119° C.) 10% | Ethyl lactate (154° C.) 90% | none | observed | observed |
| Comparative Example 8 | I | none | Ethyl lactate (154° C.) 20% N-methyl-2-pyrrolidone (202° C.) 80% | none | observed | none |
| Comparative Example 9 | J | none | γ-butyrolactone (204° C.) 100% | none | observed | none |
| Comparative Example 10 | A | Propylene glycol monomethyl ether (118–119° C.) 40% | none | Ethylene glycol dimethyl ether (85° C.) 60% | none | observed |
| Comparative Example 11 | E | none | γ-butyrolactone (204° C.) 30% | Methyl ethyl ketone (80° C.) 70% | none | observed |

INDUSTRIAL APPLICABILITY

According to the present invention, there can be provided a photosensitive resin composition which does not cause defects such as transcribed trace and line drawing. Particularly, even when the photosensitive resin composition is applied by a slit die coating method, defects such as transcribed trace and line drawing can be prevented without requiring modification of an apparatus. When the photosensitive resin composition of the present invention is used, high-quality electronic components and organic electro-luminescent displays can be provided.

The invention claimed is:

1. A photosensitive resin composition comprising:
(a) a resin having a structure represented by the general formula (I):

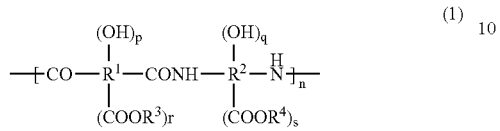

wherein $R^1$ represents a di- to octavalent organic group having at least 2 carbon atoms, $R^2$ represents a di- to hexavalent organic group having at least 2 carbon atoms, $R^3$ and $R^4$ may be the same or different and represent a hydrogen atom or an organic group having 1 to 20 carbon atoms, n is in the range from 5 to 100000, p and q each is in the range from 0 to 4, r is 1 or 2 and s is in the range from 0 to 2, and p+q>0;
(b) a photosensitive agent; and
(c) an organic solvent having a boiling point at atmospheric pressure of 100° C. or higher and 140° C. or lower, the content of the component (c) being 50% by weight or more and 100% by weight or less based on a total amount of one or more organic solvents present in the photosensitive resin composition.

2. The photosensitive resin composition of claim 1, wherein the component (a) is at least one resin selected from among resins having structures represented by the general formulas (2) to (5):

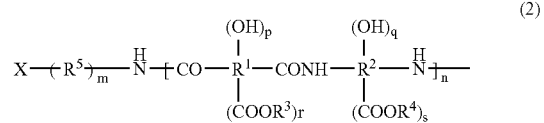

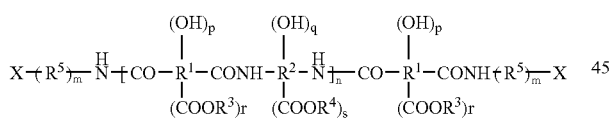

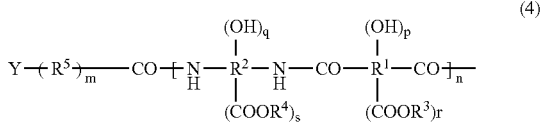

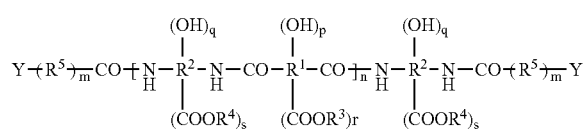

wherein $R^1$ represents a di-. to octavalent organic group having at least 2 carbon atoms, $R^2$ represents a di- to hexavalent organic group having at least 2 carbon atoms, $R^3$ and $R^4$ may be the same or different and represent a hydrogen atom or an organic group having 1 to 20 carbon atoms, $R^5$ represents a divalent organic group, X and Y each represents an organic group having at least one substituent selected from among carboxyl group, phenolic hydroxy group, sulfonic acid group, thiol group, hydrocarbon group having at least one unsaturated hydrocarbon group and 1 to 10 carbon atoms, nitro group, methylol group, ester group and hydroxyalkynyl group, n is in the range from 5 to 100000, m is in the range from 0 to 10, p and q each is in the range from 0 to 4, r is 1 or 2 and s is in the range from 0 to 2, and p+q>0.

3. A photosensitive resin composition comprising:
(a) a resin;
(b) a photosensitive agent; and
(c) an organic solvent having a boiling point at atmospheric pressure of 100° C. or higher and 140° C. or lower, the content of the component (c) being 50% by weight or more and 100% by weight or less based on a total amount of one or more organic solvents present in the photosensitive resin composition, wherein the resin of component (a) is at least one resin selected from among resins having structures represented by the general formulas (2) to (5):

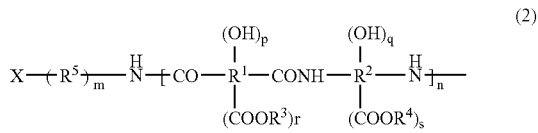

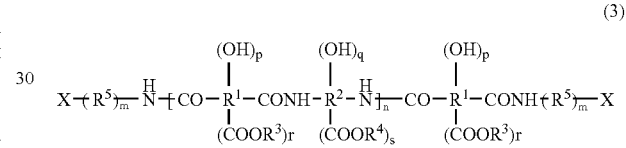

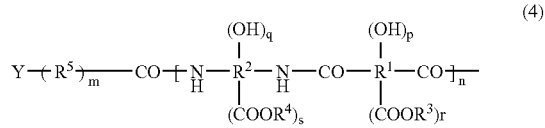

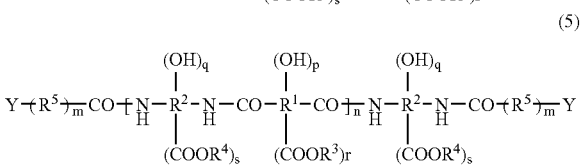

wherein $R^1$ represents a di- to octavalent organic group having at least 2 carbon atoms, $R^2$ represents a di- to hexavalent organic group having at least 2 carbon atoms, $R^3$ and $R^4$ may be the same or different and represent a hydrogen atom or an organic group having 1 to 20 carbon atoms, $R^5$ represents a divalent organic group, X and Y each represents an organic group having at least one substituent selected from among carboxyl group, phenolic hydroxy group, sulfonic acid group, thiol group, hydrocarbon group having at least one unsaturated hydrocarbon group and 1 to 10 carbon atoms, nitro group, methylol group, ester group and hydroxyalkynyl group, n is in the range from 5 to 100000, m is in the range from 0 to 10, p and q each is in the range from 0 to 4, r is 1 or 2 and s is in the range from 0 to 2, and p+q>0.

4. A photosensitive resin composition according to claim 3, wherein the component (b) is a quinonediazide compound.

5. A photosensitive resin composition according to claim 3, wherein the content of the component (c) is 70% by weight or more and 100% by weight or less based on a total amount of the one or more organic solvents.

6. A process for producing a heat-resistant resin film, comprising:
applying the photosensitive resin composition of claim 3 onto a substrate to form a photosensitive resin film;
drying the photosensitive resin film;
exposing the photosensitive resin film;
developing the exposed photosensitive resin film; and
subjecting to a heat treatment.

7. A process for producing a heat-resistant resin film according to claim 6, wherein the photosensitive resin composition is applied by a slit die coating method.

8. A process for producing a heat-resistant resin film according to claim 6, wherein the photosensitive resin film is developed with an alkali developer.

9. A process for producing an organic electro-luminescent display, comprising:
applying the photosensitive resin composition of claim 3 onto a substrate on which a first electrode is formed to form a photosensitive resin film;
drying, exposing, developing and heat-treating the photosensitive resin film to form an insulating layer;
forming a luminescent layer; and
forming a second electrode.

10. A process for producing an organic electro-luminescent display according to claim 9, wherein the insulating layer is formed so as to cover edges of the first electrode.

11. An organic electro-luminescent display comprising the heat-resistant resin film obtained by the process of claim 6.

12. Electronic components comprising the heat-resistant resin film obtained by the process of claim 6 as a surface protective coat or a dielectric film among layers.

13. The photosensitive resin composition of claim 3 wherein the organic solvent is propylene glycol monomethyl ether.

* * * * *